US012802634B2

(12) United States Patent
Ko et al.

(10) Patent No.: US 12,802,634 B2

(45) Date of Patent: Nov. 17, 2026

(54) PIXEL CIRCUIT AND DISPLAY APPARATUS COMPRISING PIXEL CIRCUIT

(71) Applicant: LG Display Co., Ltd., Seoul (KR)

(72) Inventors: Intae Ko, Daegu (KR); Seongho Cho, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/666,414

(22) Filed: May 16, 2024

(65) Prior Publication Data

US 2024/0404469 A1 Dec. 5, 2024

(30) Foreign Application Priority Data

May 30, 2023 (KR) ........................ 10-2023-0069323

(51) Int. Cl.

*G09G 3/3233* (2016.01)
*H10K 59/122* (2023.01)
*H10K 59/80* (2023.01)

(52) U.S. Cl.

CPC ......... *G09G 3/3233* (2013.01); *H10K 59/122* (2023.02); *H10K 59/879* (2023.02); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2380/10* (2013.01)

(58) Field of Classification Search

CPC ............... G09G 3/3233; G09G 3/3266; G09G 2300/0819; G09G 2300/0842; G09G 2300/0861; G09G 2300/0426; G09G 2310/08; G09G 2320/0233; G09G 2320/0214; G09G 2380/10; H10K 59/122; H10K 59/879

See application file for complete search history.

(56) References Cited

U.S. PATENT DOCUMENTS 7,284,871 B2 * 10/2007 Oon ........................ G03B 15/05 257/E33.071
2022/0123268 A1 * 4/2022 Sano ...................... H10K 59/32

(Continued)

FOREIGN PATENT DOCUMENTS

KR 20210116793 A * 9/2021
KR 10-2022-0165958 A 12/2022

(Continued)

*Primary Examiner* — Stephen G Sherman
(74) *Attorney, Agent, or Firm* — Fenwick & West LLP

(57) ABSTRACT

A display apparatus includes a mode controller that generates a first and second control signals, a gate drive circuit that generates a light-emitting signal, a pixel circuit comprising a driving transistor, a first and second transistor that receives the first and control signals, a first light-emitting element connected to the first transistor, a second light-emitting element connected to the second transistor, a third transistor connected between the driving transistor and the first transistor and operates responsive to the light-emitting signal, and a capacitor connected to a gate electrode of the driving transistor, and a first and second lens on the first and second light-emitting elements, wherein in an initialization period of the pixel circuit, a reference voltage is applied to a first electrode of the capacitor and an initialization voltage is applied to a second electrode of the capacitor.

24 Claims, 14 Drawing Sheets

(56) References Cited

U.S. PATENT DOCUMENTS

| | | | | |
|---|---|---|---|---|
| 2022/0399529 | A1 | 12/2022 | Shin et al. | |
| 2023/0042966 | A1* | 2/2023 | Huangfu | G09G 3/3258 |
| 2023/0320134 | A1* | 10/2023 | Kim | H10K 59/1213 257/40 |
| 2024/0099058 | A1 | 3/2024 | Choi et al. | |
| 2024/0257769 | A1 | 8/2024 | Kim et al. | |

FOREIGN PATENT DOCUMENTS

| | | | |
|---|---|---|---|
| KR | 10-2024-0038333 | A | 3/2024 |
| KR | 10-2024-0120274 | A | 8/2024 |

* cited by examiner

PIXEL CIRCUIT AND DISPLAY APPARATUS COMPRISING PIXEL CIRCUIT

CROSS-REFERENCE TO RELATED APPLICATION

This application claims the priority of Republic of Korea Patent Application No. 10-2023-0069323 filed on May 30, 2023, in the Korean Intellectual Property Office, which is hereby incorporated by reference in its entirety.

BACKGROUND

Field

The present specification relates to a pixel circuit and a display apparatus including the same.

Description of the Related Art

Display devices include organic light-emitting diodes (OLED) configured to autonomously emit light. The display devices are being variously used because the display device has a high response speed, high luminous efficiency, high brightness, and a large viewing angle. The display device adjusts the organic light-emitting element by adjusting the gradation of the pixels, which are arranged in a matrix shape, in accordance with video data. The pixel may include a pixel circuit, and various voltages may be inputted to the pixel circuit to operate the pixel.

The voltage inputted to the pixel circuit forms a path of an electric current flow on the pixel circuit. In some instances, several problems, such as a leak of electric current, may occur on the path of the electric current flow. For example, a voltage may be applied to an anode of the light-emitting element because of a leak of electric current. In this case, even in the case of black gradation, a black spot phenomenon may occur in which brightness increases as the light-emitting element emits light. Accordingly, there is a need to solve the problem.

SUMMARY

An object to be achieved by the embodiment of the present specification is to provide a display panel and a display apparatus, which are capable of suppressing a black spot phenomenon in an initialization section by controlling a voltage of the initialization section by using a reference voltage and an initialization voltage.

Objects of the present disclosure are not limited to the above-mentioned objects, and other objects, which are not mentioned above, can be clearly understood by those skilled in the art from the following descriptions.

In one embodiment, a display apparatus comprises: a mode controller configured to generate a first control signal and a second control signal; a gate drive circuit configured to generate a light-emitting signal; a pixel circuit comprising a driving transistor, a first transistor configured to receive the first control signal, a second transistor configured to receive the second control signal, a first light-emitting element connected to the first transistor, a second light-emitting element connected to the second transistor, a third transistor connected between the driving transistor, the first transistor, and the second transistor and configured to operate in response to the light-emitting signal, and a capacitor connected to a gate electrode of the driving transistor and including a first electrode and a second electrode; a first lens on the first light-emitting element; and a second lens on the second light-emitting element, wherein during an initialization period of the pixel circuit, a reference voltage is applied to the first electrode of the capacitor and an initialization voltage is applied to the second electrode of the capacitor while the reference voltage is applied to the first electrode of the capacitor.

In one embodiment, a pixel circuit comprises: a driving transistor including a gate electrode; a first transistor configured to receive a first control signal; a second transistor configured to receive a second control signal; a first light-emitting element connected to the first transistor; a second light-emitting element connected to the second transistor; a third transistor connected between the driving transistor and the first transistor and connected between the driving transistor and the second transistor, the third transistor configured to receive a light-emitting signal from a gate drive circuit; and a capacitor connected to the gate electrode of the driving transistor, the capacitor including a first electrode and a second electrode, wherein a first lens is on the first light-emitting element but not the second light-emitting element, and a second lens is on the second light-emitting element but not the first light-emitting element, and wherein during an initialization period of the pixel circuit, a reference voltage is applied to the first electrode of the capacitor and an initialization voltage is applied to the second electrode of the capacitor while the reference voltage is applied to the first electrode of the capacitor.

In one embodiment, a pixel circuit comprises: a driving transistor including a first electrode of the driving transistor, a second electrode of the driving transistor, and a gate electrode of the driving transistor; an emission transistor including a first electrode of the emission transistor that is connected to the second electrode of the driving transistor, a second electrode of the emission transistor, and a gate electrode configured to receive a light-emitting signal; and a first mode transistor including a first electrode of the first mode transistor that is connected to the second electrode of the emission transistor, a second electrode of the first mode transistor, and a gate electrode of the first mode transistor that is configured to receive a first control signal responsive to a first mode of the pixel circuit associated with a first viewing angle; a second mode transistor including a first electrode of the second mode transistor that is connected to the second electrode of the emission transistor and the first electrode of the first mode transistor, a second electrode of the second mode transistor, and a gate electrode of the second mode transistor that is configured to receive a second control signal responsive to a second mode of the pixel circuit associated with a second viewing angle that is different from the first viewing angle; a first light emitting diode connected to the second electrode of the first mode transistor, the first light emitting diode configured to emit light during the first mode; a second light emitting diode connected to the second electrode of the second mode transistor, the second light emitting diode configured to emit light during the second mode; and a capacitor including a first capacitor electrode and a second capacitor electrode, the second capacitor electrode connected to the gate electrode of the driving transistor, wherein during an initialization period of the pixel circuit in each of the first mode and the second mode, a reference voltage is applied to the first capacitor electrode of the capacitor and an initialization voltage is applied to the second capacitor electrode of the capacitor while the reference voltage is applied to the first capacitor electrode of the capacitor.

Other detailed matters of the exemplary embodiments are included in the detailed description and the drawings.

The pixel circuit and the display apparatus according to the present specification may suppress the black spot phenomenon in the initialization section by controlling the voltage of the initialization section by using the reference voltage and the initialization voltage.

The objects to be achieved by the present disclosure, the means for achieving the objects, and the effects of the present disclosure described above do not specify essential features of the claims, and, thus, the scope of the claims is not limited to the disclosure of the present disclosure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
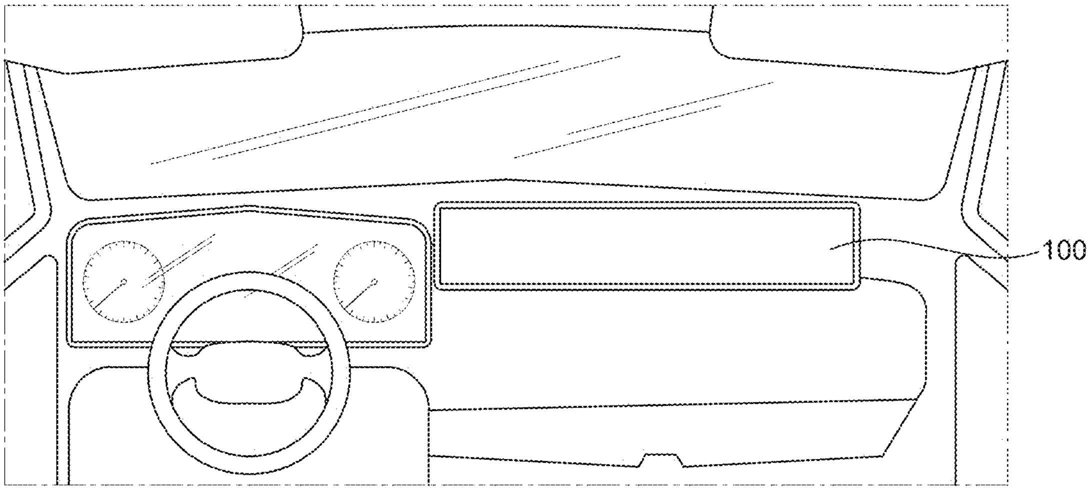
FIG. 1 is a view illustrating an example of a display apparatus according to an embodiment of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

In describing components of the exemplary embodiment of the present disclosure, terminologies such as first, second, A, B, (a), (b), and the like may be used. These terminologies are used to distinguish a component from the other component, but a nature, an order, or the number of the components is not limited by the terminology. When a component is "linked", "coupled", or "connected" to another component, the component may be directly linked or connected to the other component. However, unless specifically stated otherwise, it should be understood that a third component may be interposed between the components which may be indirectly linked or connected.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

The following embodiments will be described focusing on the organic light emitting display apparatus. However, embodiments of the present specification are not limited to organic light emitting display apparatus and can be applied to various electroluminescent displays. For example, the electroluminescent display apparatus may use an organic light emitting diode (OLED) display apparatus, a quantum dot light emitting diode display apparatus, or an inorganic light emitting diode display apparatus.

Hereinafter, exemplary embodiments of the present disclosure will be described in detail with reference to accompanying drawings.

FIG. 1 is a view illustrating an example of a display apparatus according to an embodiment of the present specification.

In the embodiment, a display apparatus 100 may be disposed on at least a part of a dashboard of a vehicle. The dashboard of the vehicle includes a configuration disposed at a front side of a front seat (e.g., a driver seat or a passenger seat) of the vehicle. For example, the dashboard of the vehicle may be equipped with an input configuration for manipulating various functions (e.g., an air conditioner, an audio system, and a navigation system) in the vehicle.

In the embodiment, the display apparatus 100 may be disposed on the dashboard of the vehicle and operate as an input part for manipulating at least some of various functions of the vehicle. The display apparatus 100 may provide various types of information related to the vehicle, e.g., driving information of the vehicle (e.g., a current speed of the vehicle, a remaining fuel amount, and a traveling distance), and information on components of the vehicle (e.g., a degree of damage to a vehicle tire).

In the embodiment, the display apparatus 100 may be disposed to traverse the driver seat and the passenger seat disposed as the front seat of the vehicle. Users of the display apparatus 100 may include a driver of the vehicle, and a fellow passenger seated in the passenger seat. Both the driver and the fellow passenger in the vehicle may use the display apparatus 100.

In the embodiment, only a part of the display apparatus 100 may be illustrated in FIG. 1. The display apparatus 100 illustrated in FIG. 1 may be illustrated as a display panel among various components included in the display apparatus 100. For example, the display apparatus 100 illustrated in FIG. 6 may be illustrated as at least a part of a display area and at least a part of a non-display area of the display panel. The components, which exclude the components illustrated in FIG. 1 among the components of the display apparatus 100, may be mounted in the vehicle (or at least a part of the vehicle).

Figure 2:
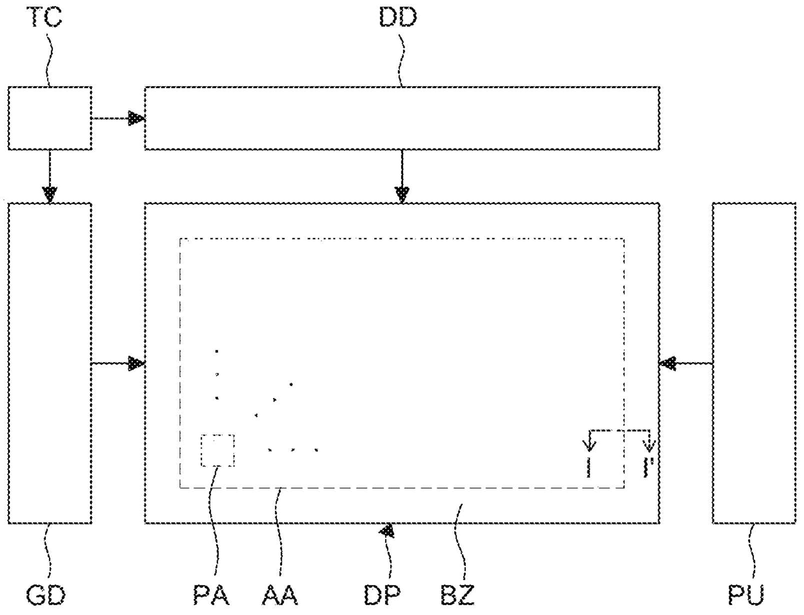
FIG. 2 is a functional block diagram of the display apparatus according to an embodiment of the present specification.

FIG. 2 is a functional block diagram of the display apparatus according to the embodiment of the present specification.

An electroluminescent display apparatus may be applied as the display apparatus according to the embodiment of the present specification. An organic light-emitting diode display apparatus, a quantum-dot light-emitting diode display apparatus, or an inorganic light-emitting diode display apparatus may be used as the electroluminescent display apparatus.

With reference to FIG. 2, the display apparatus may include a display panel DP, a data driver DD, a gate driver GD, a timing controller TC, and a power source unit PU.

In the embodiment, the display panel DP may create an image to be provided to the user. For example, the display panel DP may create and display an image, which is to be provided to the user, through a pixel area PA in which a pixel circuit is disposed.

The data driver DD, the gate driver GD, the timing controller TC, and the power source unit PU may provide signals for operating the pixel areas PA through signal lines. For example, the signal lines may include data lines DL, gate lines GL, and power voltage supply lines PL illustrated in FIG. 3.

Figure 3:
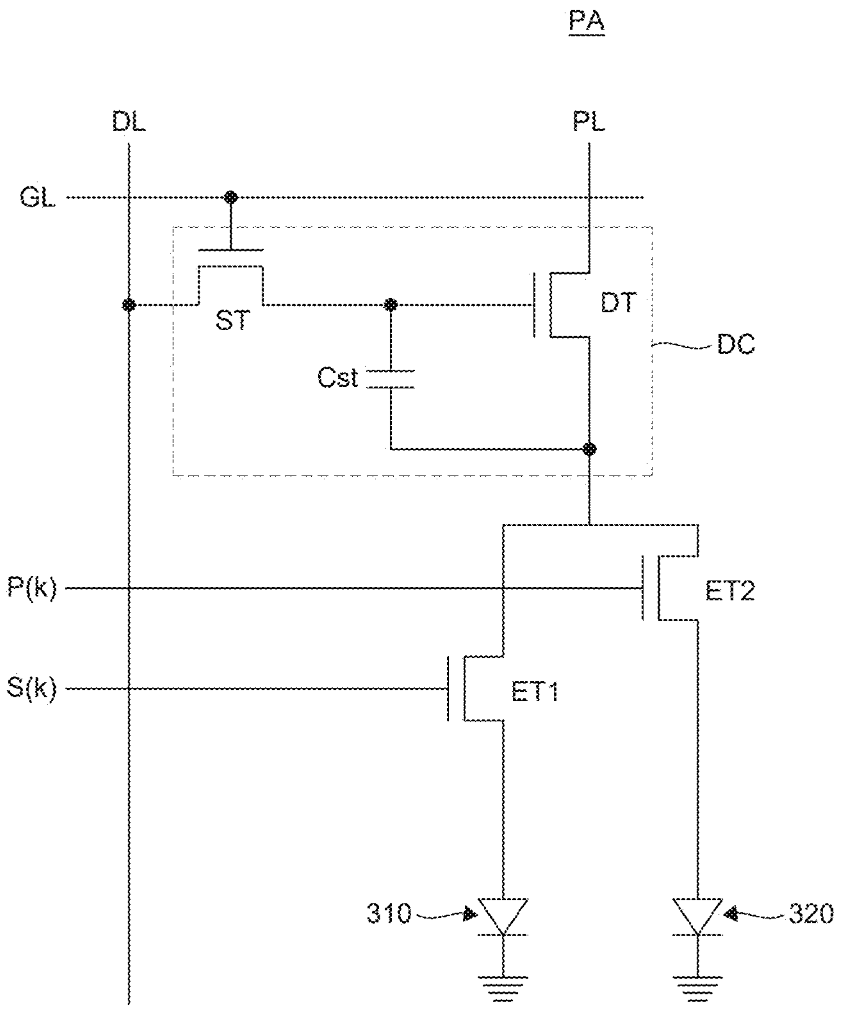
FIG. 3 is a view illustrating an example of a pixel circuit of the display apparatus according to an embodiment of the present specification.

For example, the data driver DD may apply data signals to the pixel areas PA through the data lines DL in FIG. 3, the gate driver GD may apply gate signals to the pixel areas PA through the gate lines GL, and the power source unit PU may apply power voltages to the pixel areas PA through the power voltage supply lines PL.

The timing controller TC may control the data driver DD and the gate driver GD. For example, the timing controller TC may realign digital video data, which are inputted from the outside, to fit the resolution of the display panel DP and supply the video data to the data driver DD.

The data driver DD may convert digital video data, which are inputted from the timing controller TC, into analog data voltages in response to the data control signal and supply the analog data voltages to the plurality of data lines.

The gate driver GD may generate a scan signal and a light-emitting signal (or light emission control signal) in response to the gate control signal. The gate driver GD may include a scan drive part and a light-emitting signal drive part. The scan drive part may generate scan signals in a row-sequential manner to operate at least one scan line connected to each pixel row and supply the scan signals to scan lines. The light-emitting signal drive part may generate light-emitting signals in a row-sequential manner to operate at least one light-emitting signal line connected to each pixel row and supply the light-emitting signals to light-emitting signal lines.

The gate driver (or gate drive circuit) GD may generate a plurality of scan signals and a light-emitting signal. For example, the gate driver GD may generate a first scan signal, a second scan signal, and a light-emitting signal.

According to the embodiment, the gate driver GD may be disposed on the display panel DP in a gate-driver-in-panel (GIP) manner. For example, the gate driver GD may be divided into a plurality of gate drivers and respectively disposed on at least two side surfaces of the display panel DP.

A display area AA of the display panel DP may include a plurality of pixel areas (or pixels or pixel circuits) PA. In the pixel areas PA, the plurality of data lines (e.g., the data lines DL in FIG. 3) and the plurality of gate lines (e.g., the gate lines GL in FIG. 3) intersect, and subpixels may be disposed in each intersection area. The subpixels included in one pixel area PA may emit light with different colors. For example, the pixel area PA may implement blue, red, and green by using three subpixels. However, the present specification is not limited thereto. In some instances, the pixel area PA may further include a subpixel for further implementing a particular color (e.g., white).

In the pixel area PA, the area for implementing blue may be referred to as a blue subpixel area, an area for implementing red may be referred to as a red subpixel area, and an area for implementing green may be referred to as a green subpixel area.

In the embodiment, the pixel area PA may include a plurality of subpixels. The plurality of subpixels may each be divided into first and second lens areas that provide different viewing angles. For example, the pixel area PA may include a first lens area configured to define a first viewing angle by providing light within a first range, and a second lens area configured to define a second viewing angle by providing light within a second range. The first range may be a range larger than the second range.

A non-display area BZ may be disposed along a periphery of the display area AA. Various constituent elements for operating the pixel circuit disposed in the pixel area PA may be disposed in the non-display area BZ. For example, at least a part of the gate drive circuit GD may be disposed in the non-display area BZ. The non-display area BZ may be referred to as a bezel area.

FIG. 3 illustrates an example of the pixel circuit of display apparatus according to an embodiment of the present specification. The pixel area PA may include the plurality of subpixels for implementing different colors, and the pixel circuits respectively corresponding to the plurality of subpixels. FIG. 3 illustrates an example of the pixel circuit of one subpixel disposed in the pixel area PA.

With reference to FIG. 3, the pixel circuit may include a plurality of transistors DT, ST, ET1, and ET2, a capacitor Cst, and a plurality of light-emitting elements 310 and 320.

A driving transistor DT and the capacitor Cst may be connected to a switching transistor ST. A first electrode of the driving transistor DT may be connected to the power voltage supply line PL.

The switching transistor ST may be connected to the gate line GL and supplied with the gate signal. The switching transistor ST may be turned on or off by the gate signal. The first electrode of the switching transistor ST may be connected to the data line DL. A second electrode of the switching transistor ST may be connected to a gate electrode of the driving transistor DT. In this case, the data signal may be supplied to the gate electrode of the driving transistor DT through the switching transistor ST on the basis that the switching transistor ST is turned on.

The capacitor Cst may be disposed between a gate electrode and the second electrode of the driving transistor DT. The capacitor Cst may maintain a signal applied to the gate electrode of the driving transistor DT, for example, maintain the data signal for one frame.

According to the embodiment, the driving transistor DT, the switching transistor ST, and the capacitor Cst may be constituent elements for operating light-emitting operations of the light-emitting elements (e.g., a first light-emitting element 310 and a second light-emitting element 320) and referred to as a drive part DC. However, the present specification is not limited by these terms.

The first light-emitting element 310 may be connected to a first transistor ET1 that is turned on or off by a first control signal S(k). The second light-emitting element 320 may be connected to a second transistor ET2 that is turned on or off by a second control signal P(k).

In this case, the first light-emitting element 310 or the second light-emitting element 320 may be connected to other components of the pixel circuit, e.g., the driving transistor DT in accordance with a mode. The mode may be determined in case that a condition, which is designated by a user's input or designated in advance, is satisfied. For example, in case that a predesignated first condition is satisfied, the first light-emitting element 310 emits light on the basis of the supply of the first control signal S(k). In case that a predesignated second condition is satisfied, the second light-emitting element 320 may emit light on the basis of the supply of the second control signal P(k). The first condition may include a predesignated condition for an operation to a first mode. The second condition may include a predesignated condition for an operation to a second mode.

The plurality of transistors DT, ST, ET1, and ET2 in FIG. 3 may include at least one of oxide semiconductors such as amorphous silicon, polycrystalline silicon, and IGZO. The first or second electrode of the transistor may be a source electrode or a drain electrode. For example, the first electrode may be a source electrode, or the second electrode may be a drain electrode. As another example, the first electrode may be a drain electrode, and the second electrode may be a source electrode.

Figure 4:
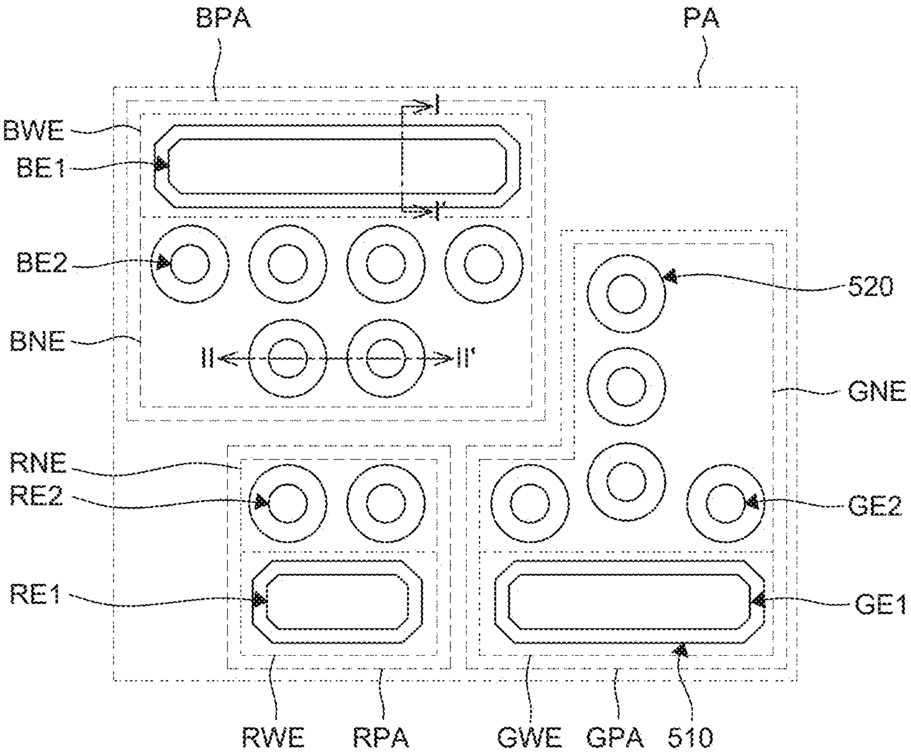
FIG. 4 is a view illustrating an example of the arrangement of lenses included in the display apparatus according to an embodiment of the present specification.
Figure 5:
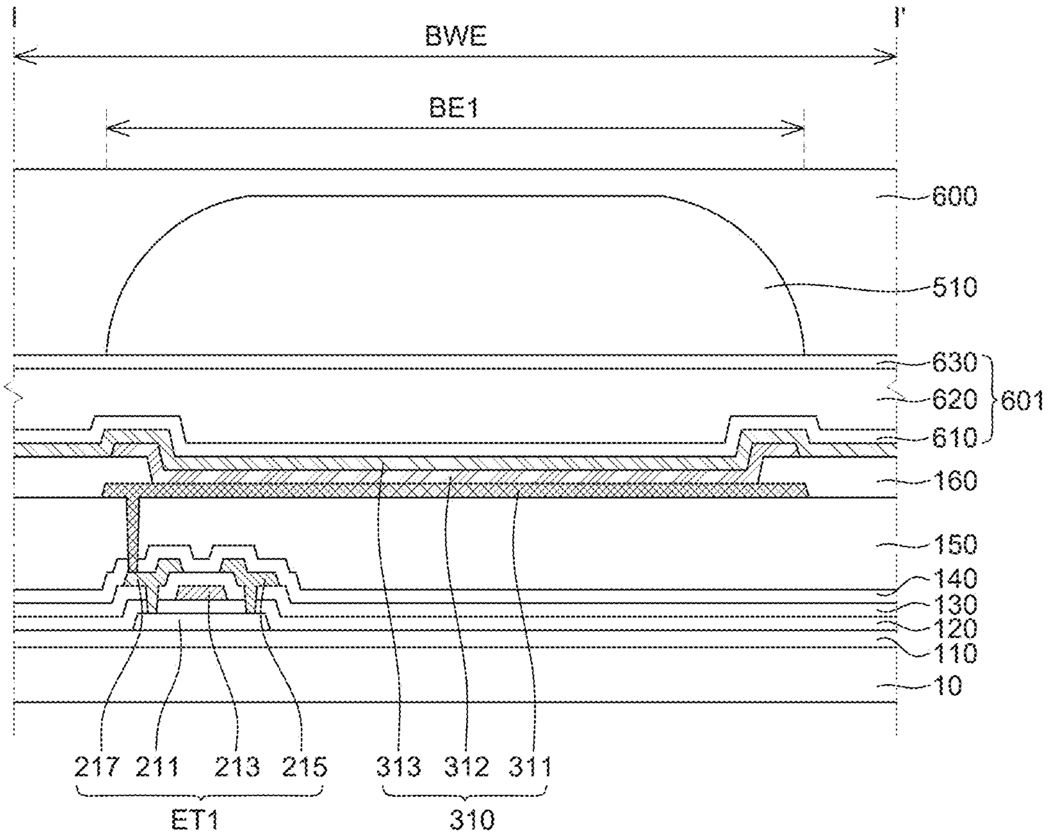
FIG. 5 is a view illustrating an example of a cross-section taken along line I-I' in FIG. 4 an embodiment of the present specification.
Figure 6:
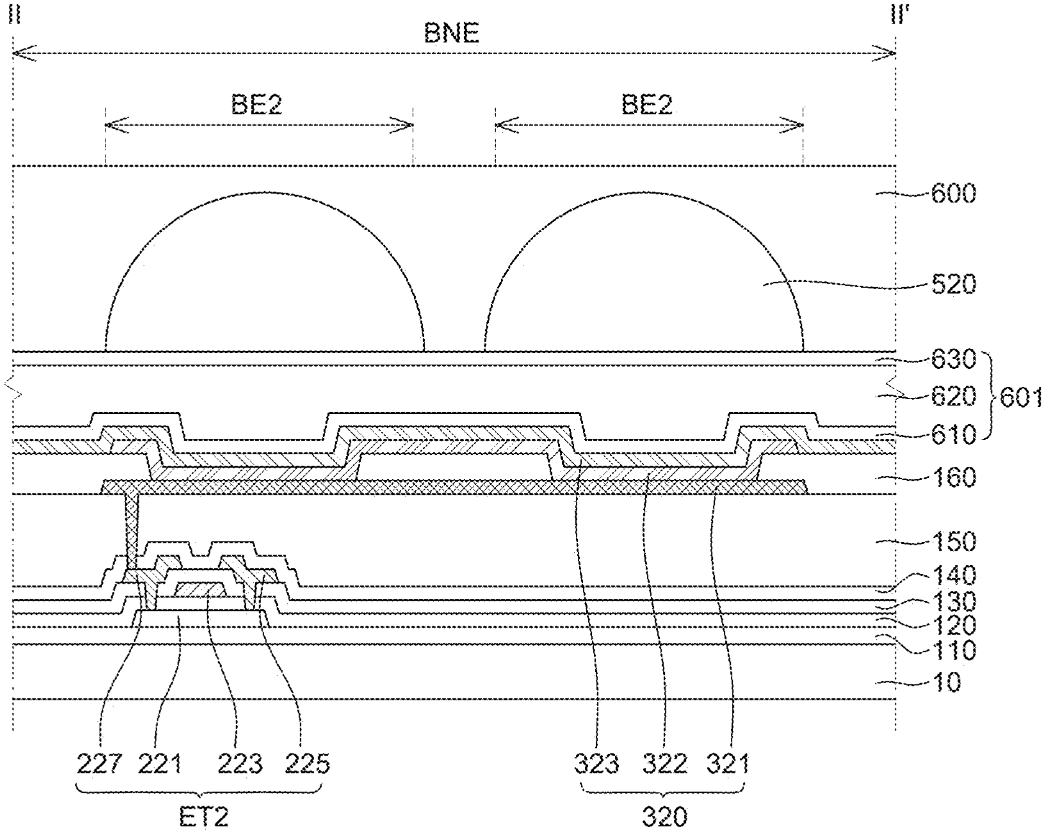
FIG. 6 is a view illustrating an example of a cross-section taken along line II-II' in FIG. 4 an embodiment of the present specification.

FIG. 4 illustrates a planar surface of a part of the display apparatus according to an embodiment of the present specification. FIG. 4 illustrates a planar surface of the pixel area PA in case that three subpixels are disposed in the pixel area PA. FIG. 5 illustrates a cross-section taken along line I-I' in FIG. 4 apparatus according to an embodiment of the present specification, and FIG. 6 illustrates a cross-section taken along line II-II' in FIG. 4 apparatus according to an embodiment of the present specification. Hereinafter, the present specification will be described with reference to FIGS. 4 to 6.

In FIG. 4, the pixel area PA may include a blue subpixel area BPA configured to emit blue light, a red subpixel area RPA configured to emit red light, and a green subpixel area GPA configured to emit green light. According to the embodiment, the blue subpixel area BPA may correspond to a first subpixel, the red subpixel area RPA may correspond to a second subpixel, and the green subpixel area GPA may correspond to a third subpixel. The pixel circuit may correspond to each of the subpixels. The pixel circuit may be disposed to correspond each of the subpixels.

The pixel area PA may include first lens areas BWE, RWE, and GWE and second lens areas BNE, RNE, and GNE that provide different viewing angles. The second lens areas BNE, RNE, and GNE in each of the pixel areas PA may operate independently of the first lens areas BWE, RWE, and GWE in the corresponding pixel area PA. For example, the pixel areas PA may each include the first light-emitting elements 310 (e.g., the first light-emitting elements 310 in FIG. 2) positioned in the first lens areas BWE, RWE, and GWE in the corresponding pixel area PA, and the second light-emitting elements 320 (e.g., the second light-emitting elements 320 in FIG. 2) positioned in the second lens areas BNE, RNE, and GNE in the corresponding pixel area PA.

The first light-emitting element 310 may emit light with a particular color. For example, the first light-emitting element 310 may include a first lower electrode 311, a first light-emitting layer 312, and a first upper electrode 313 sequentially stacked on a substrate 10. The substrate 10 may include an insulating material. The substrate 10 may include a transparent material. For example, the substrate 10 may include glass or plastic.

The first lower electrode 311 may include an electrically conductive material. The first lower electrode 311 may include a material having high reflectance. For example, the first lower electrode 311 may include metal such as aluminum (Al) and silver (Ag). The first lower electrode 311 may have a multilayer structure. For example, the first lower electrode 311 may have a structure in which a reflective electrode, which is made of metal, is positioned between transparent electrodes made of a transparent conductive material such as ITO and IZO.

The first light-emitting layer 312 may create light with brightness corresponding to a voltage difference between the first lower electrode 311 and the first upper electrode 313. For example, the first light-emitting layer 312 may include an emission material layer (EML) including a light-emitting material. The light-emitting material may include an organic material, an inorganic material, or a hybrid material.

The first light-emitting layer 312 may have a multilayer structure. For example, the first light-emitting layer 312 may further include at least one of a hole injection layer (HIL), a hole transport layer (HTL), an electron transport layer (ETL), and an electron injection layer (EIL).

The first upper electrode 313 may include an electrically conductive material. The first upper electrode 313 may include a material different from the material of the first lower electrode 311. A transmittance rate of the first upper electrode 313 may be higher than a transmittance rate of the first lower electrode 311. For example, the first upper electrode 313 may be configured as a transparent electrode made of a transparent conductive material such as ITO and IZO. Therefore, in the display apparatus according to the embodiment of the present specification, the light created by the first light-emitting layer 312 may be discharged through the first upper electrode 313.

The second light-emitting element 320 may implement the same color as the first light-emitting element 310. The second light-emitting element 320 may have the same structure as the first light-emitting element 310. For example, the second light-emitting element 320 may include a second lower electrode 321, a second light-emitting layer 322, and a second upper electrode 323 sequentially stacked on the substrate 10.

The second lower electrode 321 may correspond to the first lower electrode 311, the second light-emitting layer 322 may correspond to the first light-emitting layer 312, and the second upper electrode 323 may correspond to the first upper electrode 313. For example, the second lower electrode 321 may be formed for the second light-emitting element 320 while having the same structure as the first lower electrode 311. The same may apply to the second light-emitting layer 322 and the second upper electrode 323. For example, the first light-emitting element 310 and the second light-emitting element 320 may be formed to have the same structure. However, the present specification is not limited thereto. In some instances, the first light-emitting element 310 and the second light-emitting element 320 may be formed to be different from each other in at least some configurations.

In the embodiment, the second light-emitting layer 322 may be spaced apart from the first light-emitting layer 312. Therefore, in the display apparatus according to the embodiment of the present specification, it is possible to suppress light emission caused by a leakage current.

According to the embodiment of the present specification, in the display apparatus, only one of the first light-emitting layer 312 and the second light-emitting layer 322 may create light in accordance with the user's selection or a predesignated condition.

In the embodiment, the first light-emitting element 310 and the second light-emitting element 320 in the pixel area PA may be positioned on a drive part (e.g., a drive part DC in FIG. 3) in the corresponding pixel area PA. For example, at least one insulation film (e.g., an element buffer film 110, a gate insulation film 120, an interlayer insulation film 130, a lower protective film 140, and an overcoating layer 150) may be positioned on the substrate 10, and the first light-emitting element 310 and the second light-emitting element 320 in each of the pixel areas PA may be disposed on one of the insulation films. Therefore, in the display apparatus according to the embodiment of the present specification, the first light-emitting element 310 and the second light-emitting element 320 in each of the pixel areas PA may be inhibited from being unnecessarily connected to the drive part 205 of the corresponding pixel area PA.

In the embodiment, the buffer film 110, the gate insulation film 120, the interlayer insulation film 130, the lower protective film 140, and the overcoating layer 150 may be stacked on the substrate 10. The buffer film 110 may include an insulating material. For example, the buffer film 110 may include an inorganic insulating material such as silicon oxide (SiOx) and silicon nitride (SiNx). The buffer film 110 may have a multilayer structure. For example, the buffer film 110 may have a stacked structure including a film made of silicon nitride (SiNx) and a film made of silicon oxide (SiOx).

In the embodiment, the buffer film 110 may be positioned between the element substrate 10 and the drive part 205 in each of the pixel areas PA. The buffer film 110 may suppress the contamination caused by the substrate 10 during the process of forming the drive part DC. For example, a top surface of the substrate 10, which is directed toward the drive part DC in each of the pixel areas PA, may be covered by the buffer film 110. The drive part DC may be positioned on the buffer film 110 in each of the pixel areas PA.

In the embodiment, the gate insulation film 120 may include an insulating material. For example, the gate insulation film 120 may include an inorganic insulating material such as silicon oxide (SiO) and silicon nitride (SiN). The gate insulation film 120 may include a material having high permittivity. For example, the gate insulation film 120 may include a high-K material such as hafnium oxide (HfO). The gate insulation film 120 may have a multilayer structure.

The gate insulation film 120 may be positioned on the buffer film 110. The gate insulation film 120 may extend between the semiconductor layer and the gate electrode of the transistor. For example, the gate electrodes of the switching transistor ST and the driving transistor DT may be insulated from the semiconductor layers of the switching transistor ST and the driving transistor DT by the gate insulation film 120. The gate insulation film 120 may cover first and second semiconductor layers in each of the pixel areas PA. The gate electrodes of the switching transistor ST and the driving transistor DT may be positioned on the gate insulation film 120.

The interlayer insulation film 130 may include an insulating material. For example, the interlayer insulation film 130 may include an inorganic insulating material such as silicon oxide (SiO) and silicon nitride (SiN). The interlayer insulation film 130 may be positioned on the gate insulation film 120. The interlayer insulation film 130 may extend between the gate electrodes and the source electrodes and between the gate electrodes and the drain electrodes of the driving transistor DT and the switching transistor ST. For example, the source electrodes and the drain electrodes of the driving transistor DT and the switching transistor ST may be insulated from the gate electrodes by the interlayer insulation film 130. The interlayer insulation film 130 may cover the gate electrodes of the switching transistor ST and the driving transistor DT. The source electrode and the drain electrode in each of the pixel areas PA may be positioned on the interlayer insulation film 130. The gate insulation film 120 and the interlayer insulation film 130 may expose source and drain areas of each semiconductor pattern positioned in each of the pixel areas PA.

In the embodiment, the lower protective film 140 may include an insulating material. For example, the lower protective film 140 may include an inorganic insulating material such as silicon oxide (SiO) and silicon nitride (SiN). The lower protective film 140 may be positioned on the interlayer insulation film 130. The lower protective film 140 may suppress damage to the drive part 205 caused by external moisture and impact. The lower protective film 140 may extend along a surface of the driving transistor DT and a surface of the switching transistor ST that are opposite to the substrate 10. The lower protective film 140 may be in contact with the interlayer insulation film 130 outside the drive part 205 positioned in each of the pixel areas PA.

The overcoating layer 150 may include an insulating material. The overcoating layer 150 may include a material different from the material of the lower protective film 140. For example, the overcoating layer 150 may include an organic insulating material. The overcoating layer 150 may be positioned on the lower protective film 140. The overcoating layer 150 may remove a level difference caused by the drive part 205 in each of the pixel areas PA. For example, a top surface of the overcoating layer 150, which is opposite to the element substrate 10, may be a flat surface.

In the embodiment, the first transistor ET1 may be electrically connected between the drain electrode of the driving transistor DT and the first lower electrode 311 of the first light-emitting element 310. The second transistor ET2 may be electrically connected between the drain electrode of the driving transistor DT and the second lower electrode 321 of the second light-emitting element 320.

The first transistor ET1 may include a first semiconductor layer 211, a first gate electrode 213, a first source electrode 215, and a first drain electrode 217. A first transistor T1 may have the same structure as the switching transistor ST and the driving transistor DT. For example, the first semiconductor layer 211 may be positioned between the buffer film 110 and the gate insulation film 120, and the first gate electrode 213 may be positioned between the gate insulation film 120 and the interlayer insulation film 130. The first source electrode 215 and the first drain electrode 217 may be positioned between the interlayer insulation film 130 and the lower protective film 140. The first gate electrode 213 may overlap a channel area of the first semiconductor layer 211. The first source electrode 215 may be electrically connected to a source area of the first semiconductor layer 211. The first drain electrode 217 may be electrically connected to a drain area of the first semiconductor layer 211.

In the embodiment, the second transistor ET2 may include a second semiconductor layer 221, a second gate electrode 223, a second source electrode 225, and a second drain electrode 227. For example, the second semiconductor layer 221 may be positioned on the same layer as the first semiconductor layer 211, the second gate electrode 223 may be positioned on the same layer as the first gate electrode 213, and the second source electrode 225 and the second drain electrode 227 may be positioned on the same layer as the first source electrode 215 and the first drain electrode 217.

In the embodiment, the first transistor ET1 may be formed simultaneously with the switching transistor ST and the driving transistor DT. The first transistor ET1 may be formed simultaneously with the second transistor ET2.

The first light-emitting element 310 and the second light-emitting element 320 in each of the pixel areas PA may be positioned on the overcoating layer 150 in the corresponding pixel area PA. For example, the first lower electrode 311 of the first light-emitting element 310 may be electrically connected to the first drain electrode 217 (or the first source electrode 215) of the first transistor ET1 through contact holes formed through the lower protective film 140 and the overcoating layer 150, and the second lower electrode 321 of the second light-emitting element 320 may be electrically connected to the second drain electrode 227 (or the second source electrode 225) of the second transistor ET2 through contact holes formed through the lower protective film 140 and the overcoating layer 150.

The second lower electrode 321 in each of the pixel areas PA may be spaced apart from the first lower electrode 311 in the corresponding pixel area PA. For example, a bank insulation film 160 may be positioned between the first lower electrode 311 and the second lower electrode 321 in each of the pixel areas PA. The bank insulation film 160 may include an insulating material. For example, the bank insulation film 160 may include an organic insulating material. The bank insulation film 160 may include a material different from the material of the overcoating layer 150.

The second lower electrode 321 in each of the pixel areas PA may be insulated from the first lower electrode 311 in the corresponding pixel area PA by the bank insulation film 160. For example, the bank insulation film 160 may cover an edge of the first lower electrode 311 and an edge of the second lower electrode 321 positioned in each of the pixel areas PA. Therefore, the display apparatus may provide the user with images made by the first lens areas BWE, RWE, and GWE in each of the pixel areas PA in which the first light-emitting element 310 is positioned or images made by the second lens areas BNE, RNE, and GNE in each of the pixel areas PA in which the second light-emitting element 320 is positioned.

The first light-emitting layer 312 and the first upper electrode 313 of the first light-emitting element 310, which is positioned in each of the pixel areas PA, may be stacked in a partial area of the corresponding first lower electrode 311 exposed by the bank insulation film 160. The second light-emitting layer 322 and the second upper electrode 323 of the second light-emitting element 320, which is positioned in each of the pixel areas PA, may be stacked in a partial area of the corresponding second lower electrode 321 exposed by the bank insulation film 160. For example, in each of the pixel areas PA, the bank insulation film 160 may be divided into first light-emitting areas BE1, RE1, and GE1 in which light is emitted by the first light-emitting element 310, and second light-emitting areas BE2, RE2, and GE2 in which light is emitted by the second light-emitting element 320. In each of the pixel areas PA, a size of each of the second light-emitting areas BE2, RE2, and GE2 may be smaller than a size of each of the first light-emitting areas BE1, RE1, and GE1.

In each of the pixel areas PA, the second upper electrode 323 may be electrically connected to the first upper electrode 313 in the corresponding pixel area PA. For example, a voltage, which is applied to the second upper electrode 323 of the second light-emitting element 320 positioned in each of the pixel areas PA, may be equal to a voltage applied to the first upper electrode 313 of the first light-emitting element 310 positioned in the corresponding pixel area PA. The second upper electrode 323 in each of the pixel areas PA may include the same material as the first upper electrode 313 in the corresponding pixel area PA. For example, the second upper electrode 323 in each of the pixel areas PA may be formed simultaneously with the first upper electrode 313 in the corresponding pixel area PA. The second upper electrode 323 in each of the pixel areas PA may extend on the bank insulation film 160 and be in direct contact with the first upper electrode 313 in the corresponding pixel area PA. The brightness in the first lens areas BWE, RWE, and GWE positioned in each of the pixel areas PA and the brightness in the second lens areas BNE, RNE, and GNE may be controlled by a drive current generated in the corresponding pixel area PA.

An encapsulation member 601 may be positioned on the first light-emitting element 310 and the second light-emitting element 320 in each of the pixel areas PA. The encapsulation member 601 may suppress damage to the light-emitting elements 310 and 320 caused by moisture and impact from the outside. The encapsulation member 601 may have a multilayer structure. For example, the encapsulation member 800 may include a first encapsulation layer 610, a second encapsulation layer 620, and a third encapsulation layer 630 sequentially stacked. However, the embodiments of the present specification are not limited thereto. For example, the encapsulation member 601 may include a first encapsulation layer 610, a second encapsulation layer 620, and a third encapsulation layer 630 sequentially stacked. However, the embodiments of the present specification are not limited thereto. The second encapsulation layer 620 may include a material different from the material of the first encapsulation layer 610 and the third encapsulation layer 630. For example, the first encapsulation layer 610 and the third encapsulation layer 630 are inorganic encapsulation layers including an inorganic insulating material, and the second encapsulation layer 820 may include an organic encapsulation layer including an organic insulating material. Therefore, damage to the light-emitting elements 310 and 320 of the display apparatus caused by moisture and impact from the outside may be more effectively suppressed.

First lenses 510 and second lenses 520 may be positioned on the encapsulation member 800 in each of the pixel areas PA.

The first lenses 510 may be positioned on the first lens areas BWE, RWE, and GWE in each of the pixel areas PA. For example, the light, which is created by the first light-emitting element 310 in each of the pixel areas PA, may be discharged through the first lens 510 in the corresponding pixel area PA. The first lens 510 may have a shape in which at least light in one direction may not be restricted. For example, a planar shape of the first lens 510 positioned in each of the pixel areas PA may be a bar shape extending in a first direction.

In this case, the propagation direction of the light emitted from the first lens areas BWE, RWE, and GWE in the pixel area PA is not limited to the first direction. For example, the content (or images) provided through the first lens areas BWE, RWE, and GWE in the pixel area PA may be shared with surrounding people adjacent to the user in the first direction. The case in which the content is provided through the first lens areas BWE, RWE, and GWE is a mode in which the content is provided within a first viewing angle range larger than a second viewing angle range in which the second lens areas BNE, RNE, and GNE are provided, and this mode may be referred to as a first mode or a sharing mode.

The second lenses 520 may be positioned on the second lens areas BNE, RNE, and GNE in each of the pixel areas PA. The light, which is created by the second light-emitting element 320 in the pixel area PA, may be discharged through the second lens 520 in the corresponding pixel area PA. The second lens 520 may restrict the propagation direction, in which light passes through the second lens 520, to the first direction and/or the second direction. For example, a planar shape of the second lens 520 positioned in the pixel area PA may be a circular shape. In this case, the propagation direction of the light emitted from the second lens areas BNE, RNE, and GNE in the pixel area PA may be restricted to the first and second directions. For example, the content provided by the second lens areas BNE, RNE, and GNE in the pixel area PA may not be shared with surrounding people adjacent to the user. The case in which the content is provided through the second lens areas BNE, RNE, and GNE is a mode in which the content is provided within the second viewing angle range smaller than the first viewing angle range in which the first lens areas BWE, RWE, and GWE are provided, and this mode may be referred to as a second mode or a privacy mode.

The first light-emitting areas BE1, RE1, and GE1 included in the first lens areas BWE, RWE, and GWE in each of the pixel areas PA may have shapes corresponding to the first lenses 510 positioned in the first lens areas BWE, RWE, and GWE in the corresponding pixel area PA. For example, planar shapes of the first light-emitting areas BE1, RE1, and GE1 defined in the first lens areas BWE, RWE, and GWE in each of the pixel areas PA may each be a bar shape extending in the first direction. The first lenses 510 positioned in the first lens areas BWE, RWE, and GWE in the pixel area PA may have sizes larger than those of the first light-emitting areas BE1, RE1, and GE1 included in the first lens areas BWE, RWE, and GWE in the corresponding pixel area PA. Therefore, it is possible to improve the efficiency of the light emitted from the first light-emitting areas BE1, RE1, and GE1 in the pixel area PA.

The second light-emitting areas BE2, RE2, and GE2 included in the second lens areas BNE, RNE, and GNE in each of the pixel areas PA may have shapes corresponding to the second lenses 520 positioned in the second lens areas BNE, RNE, and GNE in the corresponding pixel area PA. For example, planar shapes of the second light-emitting areas BE2, RE2, and GE2 included in the second lens areas BNE, RNE, and GNE in the pixel area PA may each be a circular shape. The second lenses 520 positioned in the second lens areas BNE, RNE, and GNE in the pixel area PA may have sizes larger than those of the second light-emitting areas BE2, RE2, and GE2 included in the second lens areas BNE, RNE, and GNE in the corresponding pixel area PA. For example, planar shapes of the second light-emitting areas BE2, RE2, and GE2 positioned in the second lens areas BNE, RNE, and GNE in each of the pixel areas PA may be circular shapes concentric to planar shapes of the second lenses 520 positioned in the second lens areas BNE, RNE, and GNE in the corresponding pixel area PA. In this case, it is possible to improve the efficiency of the light emitted from the second light-emitting areas BE2, RE2, and GE2 in the pixel area PA.

In the embodiment, the first lens area BWE, RWE, or GWE in the pixel area PA may include one first light-emitting area BE1, RE1, or GE1. The second lens areas BNE, RNE, and GNE in the pixel area PA may include the plurality of second light-emitting areas BE2, RE2, and GE2.

In the embodiment, one first lens 510 may be disposed in the first lens area BWE, RWE, or GWE in the pixel area PA. The plurality of second lenses 520 may be disposed in the second lens areas BNE, RNE, and GNE in the pixel area PA.

In the embodiment, the second light-emitting areas BE2, RE2, and GE2 included in the second lens areas BNE, RNE, and GNE in the pixel area PA may operate for the respective subpixel areas. The second light-emitting areas (e.g., the second light-emitting areas BE2, the second light-emitting areas RE2, or the second light-emitting areas GE2) included in one subpixel area may operate simultaneously.

In the embodiment, one second lower electrode 321 may be positioned in the second lens area BNE, RNE, or GNE in each of the pixel areas PA. The bank insulation film 160 between the second light-emitting areas BE2, RE2, and GE2 may be positioned between the second lower electrode 321 and the second light-emitting layer 322. The bank insulation film 160, which is disposed between the second light-emitting areas BE2, between the second light-emitting areas RE2, and/or between the second light-emitting areas GE2, may be positioned between the second lower electrode 321 and the second light-emitting layer 322. The second light-emitting layer 322, which is disposed between the second light-emitting areas BE2, RE2, and GE2 in the second lens areas BNE, RNE, and GNE, may be spaced apart from the second lower electrode 321 by the bank insulation film 160. In this case, it is possible to improve the luminous efficiency of the second light-emitting areas BE2, RE2, and GE2.

In the embodiment, areas of the second light-emitting areas BE2, RE2, and GE2 positioned in the second lens areas BNE, RNE, and GNE in the pixel area PA may be designated as particular values. For example, the areas of the second light-emitting areas BE2, RE2, and GE2 positioned in the second lens areas BNE, RNE, and GNE may be implemented to be equal to one another. The area of each of the second light-emitting areas BE2, RE2, and GE2 positioned in the second lens areas BNE, RNE, and GNE in the pixel area PA may be equal to the area of each of the second light-emitting areas BE2, RE2, and GE2 included in the second lens areas BNE, RNE, and GNE in the adjacent pixel area PA.

In the embodiment, the number of second light-emitting areas may vary depending on the subpixel areas RPA, GPA, and BPA. For example, the number of second light-emitting areas BE2 defined in the second lens area BNE in the blue subpixel area BPA may be larger than the number of second light-emitting areas RE2 defined in the second lens area RNE in the red subpixel area RPA. The number of second light-emitting areas RE2 defined in the second lens area RNE in the red subpixel area RPA may be larger than the number of second light-emitting areas GE2 defined in the second lens area GNE in the green subpixel area GPA. In this case, the efficiency deviation between the second light-emitting elements 320 positioned in the second lens areas BNE, RNE, and GNE in the pixel area PA may be compensated by the number of second light-emitting areas BE2, RE2, and GE2 defined in the second lens areas BNE, RNE, and GNE in each of the pixel areas PA.

In the embodiment, the sizes of the first light-emitting areas BE1, RE1, and GE1 may be different from one another for the respective subpixel areas RPA, GPA, and BPA. For example, the first light-emitting area BE1 in the blue subpixel area BPA may have a different size from the first light-emitting area RE1 in the red subpixel area RPA and have a different size from first light-emitting area GE1 in the green subpixel area GPA. The size of the first light-emitting area BE1 in the blue subpixel area BPA may be larger than the size of the first light-emitting area RE1 in the red subpixel area RPA. The size of the first light-emitting area RE1 in the red subpixel area RPA may be larger than the size of the first light-emitting area GE1 in the green subpixel area GPA. Therefore, in the display apparatus according to the embodiment of the present specification, the efficiency deviation between the first light-emitting elements 310 positioned in the first lens areas BWE, RWE, and GWE in each of the pixel areas PA may be compensated by the sizes of the first light-emitting areas BE1, RE1, and GE1 defined in the first lens areas BWE, RWE, and GWE in each of the pixel areas PA.

In the embodiment, a lens protective film 600 may be positioned on the first lens 510 and the second lens 520 in the pixel area PA. The lens protective film 600 may include an insulating material. For example, the lens protective film 600 may include an organic insulating material. A refractive index of the lens protective film 600 may be less than a refractive index of the first lens 510 and a refractive index of the second lens 520 positioned in each of the pixel areas PA. Therefore, in the display apparatus according to the embodiment of the present specification, the light, which has passed through the first lens 510 and the second lens 520 in each of the pixel areas PA, may not be reflected toward the substrate 10 because of a difference from the refractive index of the lens protective film 600.

Figure 7:
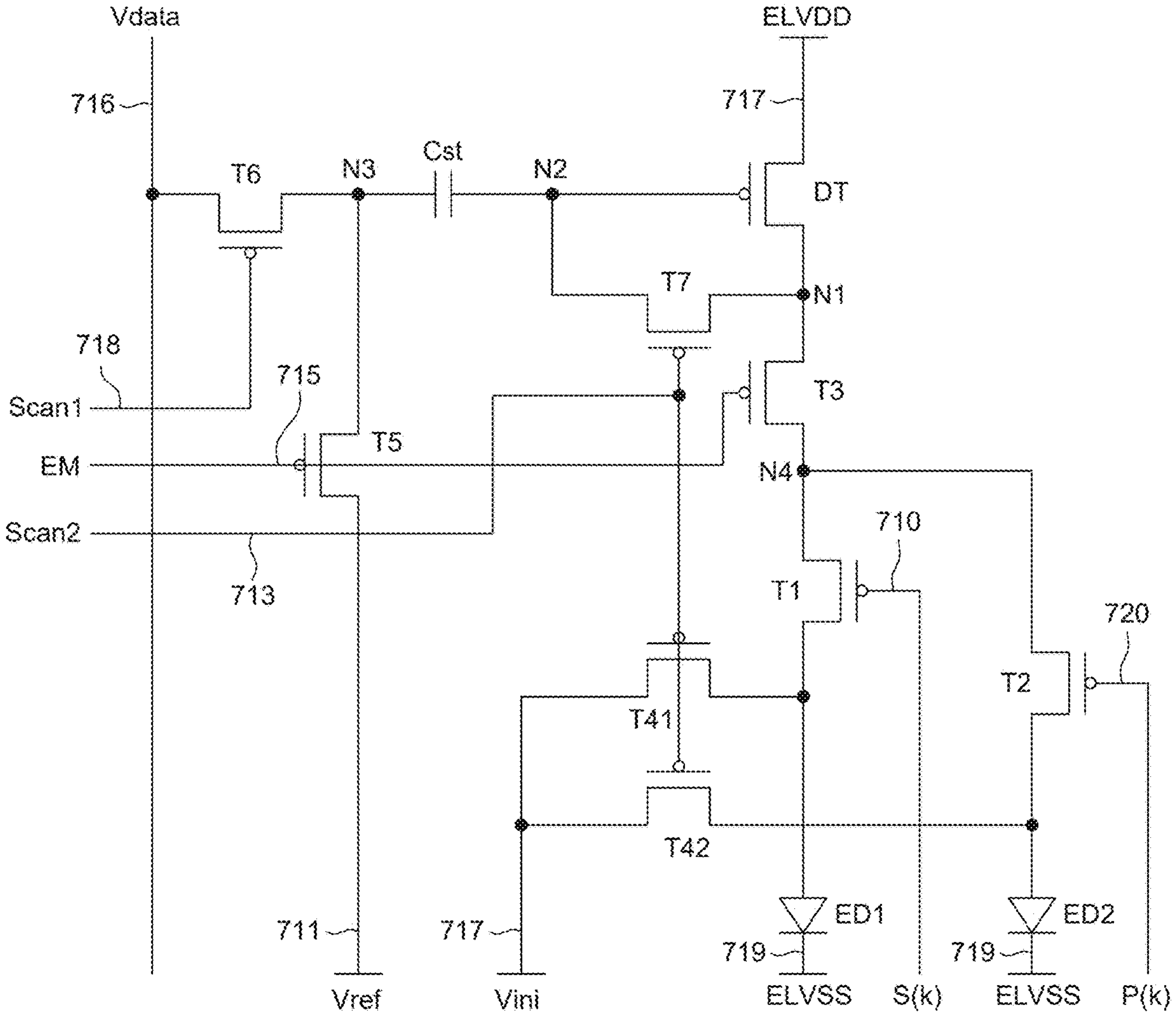
FIG. 7 is a view illustrating the pixel circuit of the display apparatus according to an embodiment of the present specification.

FIG. 7 is a view illustrating the pixel circuit of the display apparatus according to the embodiment of the present specification.

With reference to FIG. 7, the pixel circuit includes a plurality of light-emitting elements ED1 and ED2, the driving transistor DT, first to seventh transistors T1 to T7, and the capacitor Cst. The first to seventh transistors T1 to T7 may include the first transistor T1, a second transistor T2, a third transistor T3, a fourth-first transistor T41, a fourth-second transistor T42, a fifth transistor T5, a sixth transistor T6, and a seventh transistor T7.

The source electrode of the transistor to be described below may be used as the drain electrode, and the drain electrode may be used as the source electrode. In addition, according to one embodiment, the source electrode may be referred to as a first electrode, and the drain electrode may be referred to as a second electrode. However, the present specification is not limited by these terms.

In addition, hereinafter, the embodiments will be described by using the terms 'low-level voltage' and 'high-level voltage'. However, the present specification is not limited by these terms. According to the embodiment, the low-level voltage may be referred to as a first voltage level, and the high-level voltage may be referred to as a second voltage level. In this case, the low-level voltage may have a smaller voltage value than the high-level voltage. The low-level voltage may belong to a range of voltage values that may turn on a p-type TFT or turn off an and -type TFT. For example, the low-level voltage may include a voltage corresponding to a range of −8 V to −12 V. The high-level voltage may belong to a range of voltage values that may turn off the p-type TFT or turn on the and -type TFT. For example, the high-level voltage may include a voltage corresponding to a range of 6 V to 16 V. However, the embodiment of the present specification is not limited thereto.

The plurality of light-emitting elements ED1 and ED2 includes a first light-emitting element ED1 and a second light-emitting element ED2. Further, the first light-emitting element ED1 and the second light-emitting element ED2 emit light by being supplied with drive currents from the driving transistor DT. Specifically, an anode electrode of the first light-emitting element ED1 may be connected to the first transistor T1, and a cathode electrode of the first light-emitting element ED1 may be connected to an input terminal (or a low-potential voltage line 719) of a low-potential drive voltage ELVSS, such that the first light-emitting element ED1 may emit light by means of a first drive current. Further, an anode electrode of the second light-emitting element ED2 may be connected to the second transistor T2, and a cathode electrode of the second light-emitting element ED2 may be connected to the input terminal of the low-potential drive voltage ELVSS, such that the second light-emitting element ED2 may emit light by means of a second drive current.

The driving transistor DT controls the drive currents to be respectively applied to the plurality of light-emitting elements ED1 and ED2 in response to a source-gate voltage Vgs thereof. The drive currents include a first drive current and a second drive current. Further, a source electrode of the driving transistor DT is connected to an input terminal (or a high-potential voltage line 717) of a high-potential voltage ELVDD, a gate electrode of the driving transistor DT is connected to a second node N2, and a drain electrode of the driving transistor DT is connected to a first node N1.

The first transistor T1 defines a current path between the driving transistor DT, the third transistor T3, and the first light-emitting element ED1. The first transistor T1 includes a source electrode connected to a fourth node N4, a drain electrode connected to the anode electrode of the first light-emitting element ED1, and a gate electrode connected to a first control signal line 710 configured to provide the first control signal S(k). The first transistor T1 may be turned on or off in response to the first control signal S(k). The first transistor T1 defines the current path between the fourth node N4, which is the source electrode of the first transistor T1, and the first light-emitting element ED1. Therefore, the first transistor T1 defines the current path between the driving transistor DT, the third transistor T3, and the first light-emitting element ED1 in response to the first control signal S(k) at a low level, i.e., a turn-on level. Thus, the first transistor T1 operates as a first mode transistor and is turned on during the first mode.

The second transistor T2 defines a current path between the driving transistor DT, the third transistor T3, and the second light-emitting element ED2. The second transistor T2 includes a source electrode connected to the fourth node N4, a drain electrode connected to the anode electrode of the second light-emitting element ED2, and a gate electrode connected to a second control signal line 720 configured to provide the second control signal P(k). The second transistor T2 may be turned on or off in response to the second control signal P(k). The second transistor T2 defines the current path between the fourth node N4, which is the source electrode, and the second light-emitting element ED2. Therefore, the second transistor T2 defines the current path between the driving transistor DT, the third transistor T3, and the second light-emitting element ED2 in response to the second control signal P(k) at a low level, i.e., is a turn-on level. Thus, the second transistor T2 operates as a second mode transistor and is turned on during the second mode.

In the embodiment, the first electrode of the first transistor T1 may be connected to the first light-emitting element ED1 and the fourth-first transistor T41. The first electrode of the second transistor T2 may be connected to the second light-emitting element ED2 and the fourth-second transistor T42.

The third transistor T3 (e.g., an emission transistor) includes a drain electrode connected to the fourth node N4, a source electrode connected to the first node N1, and a gate electrode connected to a light-emitting signal line configured to provide a light-emitting signal EM. The third transistor T3 may be turned on or off in response to the light-emitting signal EM. The third transistor T3 defines a current path between the first node N1, which is the source electrode, and the fourth node N4 that is the drain electrode. In response to the light-emitting signal EM at a low level, i.e., a turn-on level, the third transistor T3 defines a current path between the driving transistor DT, the first transistor T1, and the first light-emitting element ED1 or a current path between the driving transistor DT, the second transistor T2, and the second light-emitting element ED2.

The fourth-first transistor T41 (e.g., a first initialization transistor) applies an initialization voltage Vini to the anode electrode of the first light-emitting element ED1. The fourth-first transistor T41 may include a source electrode connected to an initialization voltage line 717 configured to transmit the initialization voltage Vini, a drain electrode connected to the anode electrode of the first light-emitting element ED1, and a gate electrode connected to a second scan signal line 713 configured to transmit a second scan signal Scan2. Therefore, the fourth-first transistor T41 applies the initialization voltage Vini to the anode electrode of the first light-emitting element ED1 in response to the second scan signal Scan2 at a low level, i.e., a turn-on level.

The fourth-second transistor T42 (e.g., a second initialization transistor) applies the initialization voltage Vini to the anode electrode of the second light-emitting element ED2. The fourth-second transistor T42 includes a source electrode connected to the initialization voltage line 717 configured to transmit the initialization voltage Vini, a drain electrode connected to the anode electrode of the second light-emitting element ED2, and a gate electrode connected to the second scan signal line 713 configured to transmit the second scan signal Scan2. Therefore, the fourth-second transistor T42 applies the initialization voltage Vini to the anode electrode of the second light-emitting element ED2 in response to the second scan signal Scan2 at a low level, i.e., a turn-on level.

The fifth transistor T5 (e.g., a reference transistor) applies a reference voltage Vref to a third node N3. The fifth transistor T5 includes a drain electrode connected to a reference voltage line 711 configured to transmit the reference voltage Vref, a source electrode connected to the third node N3, and a gate electrode connected to a light-emitting signal line 715 configured to transmit the light-emitting signal EM. Therefore, the fifth transistor T5 applies the reference voltage Vref to the third node N3 in response to the light-emitting signal EM at a low level, i.e., a turn-on level.

The sixth transistor T6 (e.g., a data transistor) applies a data voltage Vdata, which is supplied from a data line 716, to the third node N3. The sixth transistor T6 includes a source electrode connected to the data line 716, a drain electrode connected to the third node N3, and a gate electrode connected to a first scan signal line 718 configured to transmit a first scan signal Scan1. Therefore, the sixth transistor T6 applies the data voltage Vdata, which is supplied from the data line 716, to the third node N3 in response to the first scan signal Scan1 at a low level, i.e., a turn-on level.

The seventh transistor T7 (e.g., a connection transistor) diode-connects the gate electrode and the drain electrode of the driving transistor DT. The seventh transistor T7 includes a source electrode connected to the second node N2, a drain electrode connected to the first node N1, and a gate electrode connected to the second scan signal line 713 configured to transmit the second scan signal Scan2. Therefore, the seventh transistor T7 diode-connects the gate electrode and the drain electrode of the driving transistor DT in response to the second scan signal Scan2 at a low level, i.e., a turn-on level.

The capacitor (or storage capacitor) Cst includes a first electrode (e.g., a first capacitor electrode) connected to the second node N2, and the second electrode (e.g., a second capacitor electrode) connected to the third node N3. The first electrode of the capacitor Cst is connected to the gate electrode of the driving transistor DT, and the second electrode of the capacitor Cst is connected to the fifth transistor T5 and the sixth transistor T6.

In the embodiment, the reference voltage Vref and the initialization voltage Vini may have predesignated voltage values. The reference voltage Vref may have a higher voltage value than the initialization voltage Vini. For example, the reference voltage Vref may have a voltage value corresponding to a range of 2.0 V or higher and 2.5 V or lower. The initialization voltage Vini may have a voltage value corresponding to a range of 0 V or higher and 1.0 V or lower.

Figure 8:
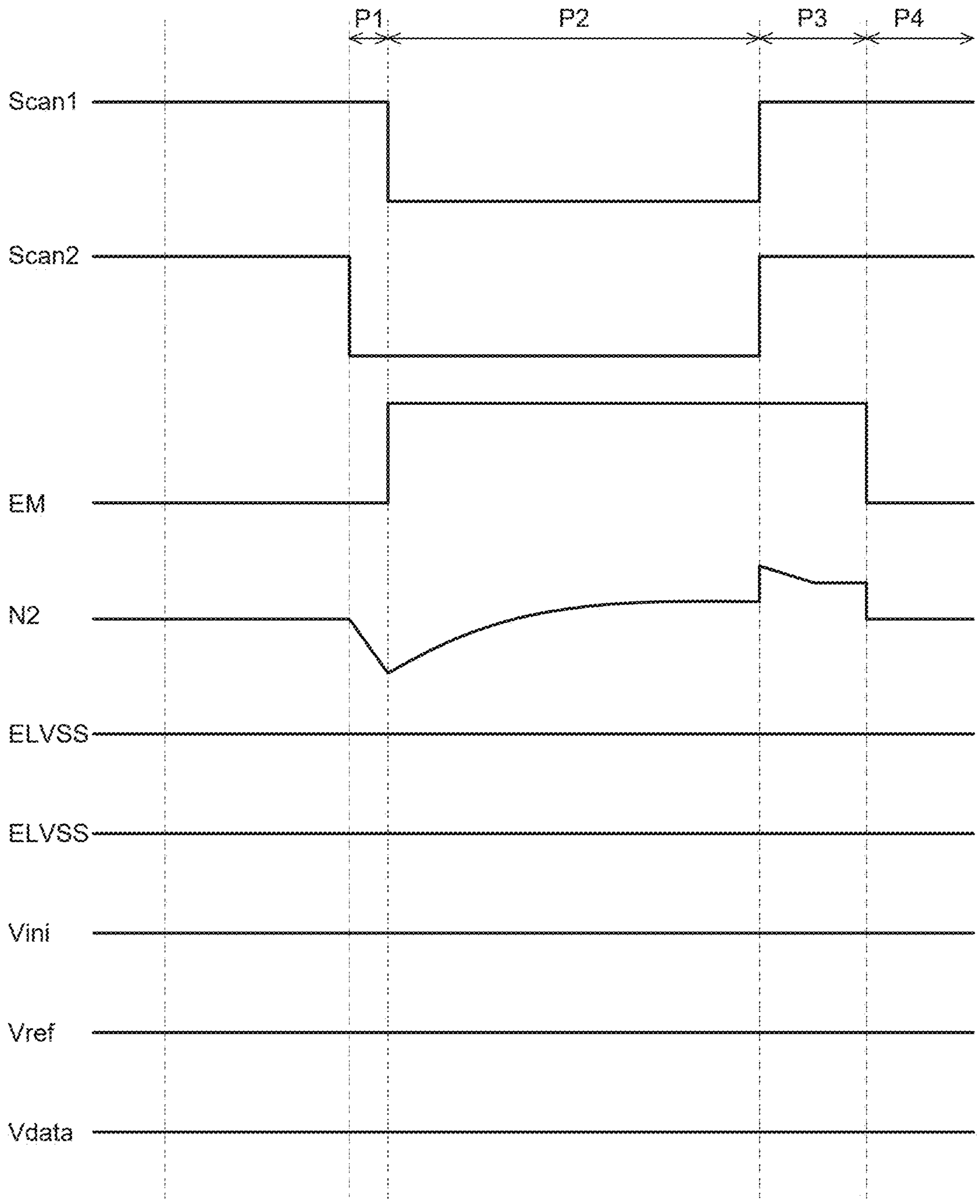
FIG. 8 is a view for explaining signals to be provided to the pixel circuit of the display apparatus according to an embodiment of the present specification.

FIG. 8 is a view for explaining signals to be provided to the pixel circuit of the display apparatus according to an embodiment of the present specification.

With reference to FIG. 8, the pixel circuit may have a plurality of operating sections. The pixel circuit may operate in an initialization (initial) section P1 (e.g., an initialization period), a sampling section P2 (e.g., a sampling period), a holding section P3 (e.g., a holding period), and a light-emitting (emission) section P4 (e.g., a light-emitting period). In some instances, the sections may be denoted by other names. For example, the initialization section P1 may be referred to as a first drive section, the sampling section P2 may be referred to as a second drive section, the holding section P3 may be referred to as a third drive section, and the light-emitting section P4 may be referred to as a fourth drive section. However, the present specification is not limited by these terms.

In the embodiment, in each of the drive sections, the pixel circuit may be provided with the first scan signal Scan1, the second scan signal Scan2, the light-emitting signal EM, the data voltage Vdata, the reference voltage Vref, the initialization voltage Vini, the high-potential voltage ELVDD, and the low-potential voltage ELVSS. The data voltage Vdata may be changed depending on the screens to be displayed through the display apparatus. The data voltage Vdata may be an AC voltage. The reference voltage Vref, the initialization voltage Vini, the high-potential voltage ELVDD, and the low-potential voltage ELVSS are voltages having predesignated values and may be provided to the pixel circuit. At least one of the first scan signal Scan1, the second scan signal Scan2, and the light-emitting signal EM may be changed depending on the drive sections.

In the embodiment, the initialization section P1 may be performed before the data voltage Vdata is supplied. In the initialization section P1, the second scan signal Scan2 and the light-emitting signal EM may be inputted as low-level voltages. In the initialization section P1, the first scan signal Scan1 may be inputted as a high-level voltage. As the second scan signal Scan2 and the light-emitting signal EM are inputted as low-level voltages, the fourth-first transistor T41, the fourth-second transistor T42, the seventh transistor T7, and the fifth transistor T5 may be turned on. The initialization of the first light-emitting element ED1 may be performed on the basis that the fourth-first transistor T41 is turned on. The initialization of the second light-emitting element ED2 may be performed on the basis that the fourth-second transistor T42 is turned on.

In the initialization section P1, the voltage value of the second node N2 may linearly decrease, as illustrated. In this case, the second node N2 may correspond to the gate electrode of the driving transistor DT. For example, the voltage value of the second node N2 may decrease to be close to a value of the initialization voltage Vini. A more specific description of the above-mentioned configuration will be described with reference to FIGS. 9 and 10.

In the embodiment, the initialization section P1 may be maintained for the time for which the light-emitting signal EM is inputted as a low-level voltage and/or the time for which the first scan signal Scan1 is inputted as a high-level voltage. For example, the initialization section P1 may end when the light-emitting signal EM changes from the low-level voltage to the high-level voltage and the first scan signal Scan1 changes from the high-level voltage to the low-level voltage. The time point (or point) at which the signal changes from the low-level voltage to the high-level voltage may be referred to as a rising time. The time point at which the signal changes from the high-level voltage to the low-level voltage may be referred to as a falling time.

Although not illustrated in FIG. 8, the pixel circuit may further receive the first control signal S(k) and/or the second control signal P(k). In the initialization section P1, the first control signal S(k) and/or the second control signal P(k) may be inputted as low-level voltages. In this case, the current path may be formed, such that the initialization voltage Vini may be provided to the second node N2. The timing at which the first control signal S(k) and the second control signal P(k) are provided may change in accordance with the embodiment. However, the present specification is not limited thereto.

A more specific example of the initialization section P1 will be described with reference to FIGS. 9 and/or 10.

In the embodiment, the light-emitting signal EM may be inputted as a high-level voltage on the basis that the initialization section P1 ends. The first scan signal Scan1 may be inputted as a low-level voltage on the basis that the initialization section P1 ends.

In the embodiment, the sampling section P2 may be performed while the data voltage Vdata is supplied to the pixel circuit. In the sampling section P2, the light-emitting signal EM may be inputted as a high-level voltage. In the sampling section P2, the first scan signal Scan1 and the second scan signal Scan2 may be inputted as low-level voltages.

According to the embodiment, as the first scan signal Scan1 and the second scan signal Scan2 are inputted as low-level voltages in the sampling section P2, the fourth-first transistor T41, the fourth-second transistor T42, the sixth transistor T6, and the seventh transistor T7 may be turned on. A sampling operation may be performed on the basis that the seventh transistor T7 is turned on. A more specific example of the sampling section P2 will be described with reference to FIG. 11.

In the sampling section P2, the second node N2 may gradually increase. The second node N2 may gently increase until the second node N2 has a voltage value corresponding to a difference between the high-potential voltage ELVDD and a threshold voltage Vth.

In the embodiment, the holding section P3 may be a section for maintaining a state made at a start point of the holding section P3. The pixel circuit may be kept in a constant state for the holding section P3. For example, in the holding section P3, a state made immediately after the sampling section P2, i.e., a state, in which no voltage is applied to the pixel circuit as if the application of the voltage is stopped for a moment, may be maintained constantly.

According to the embodiment, in the holding section P3, the light-emitting signal EM, the first scan signal Scan1, and the second scan signal Scan2 may be inputted as high-level voltages. In the holding section P3, the voltage of the second node N2 may be changed by a kickback phenomenon, as illustrated. However, the present specification is not limited thereto. In the holding section P3, the voltage of the second node N2 may be maintained at the final time point of the sampling section P2 without a kickback phenomenon.

In the embodiment, the light-emitting section P4 may be initiated on the basis that the light-emitting signal EM changes from the high-level voltage to the low-level voltage. In the light-emitting section P4, the first light-emitting element ED1 and/or the second light-emitting element ED2 may emit light. In the light-emitting section P4, the first scan signal Scan1 and the second scan signal Scan2 may be inputted as high-level voltages. In the light-emitting section P4, the light-emitting signal EM may be inputted as a low-level voltage. A more specific example of the fourth drive section P4 will be described with reference to FIG. 12.

In the light-emitting section P4, the voltage of the second node N2 may correspond to a voltage value made by subtracting the source-gate voltage Vgs from the high-potential voltage ELVDD. For example, in the light-emitting section P4, the voltage of the second node N2 may correspond to a value of "ELVDD−Vth−Vdata+Vref".

In the embodiment, the initialization section P1, the sampling section P2, the holding section P3, and the light-emitting section P4 may be sequentially performed. However, the present specification is not limited thereto. In some instances, another section may be added between at least two sections, or at least one section may be excluded.

Figure 9:
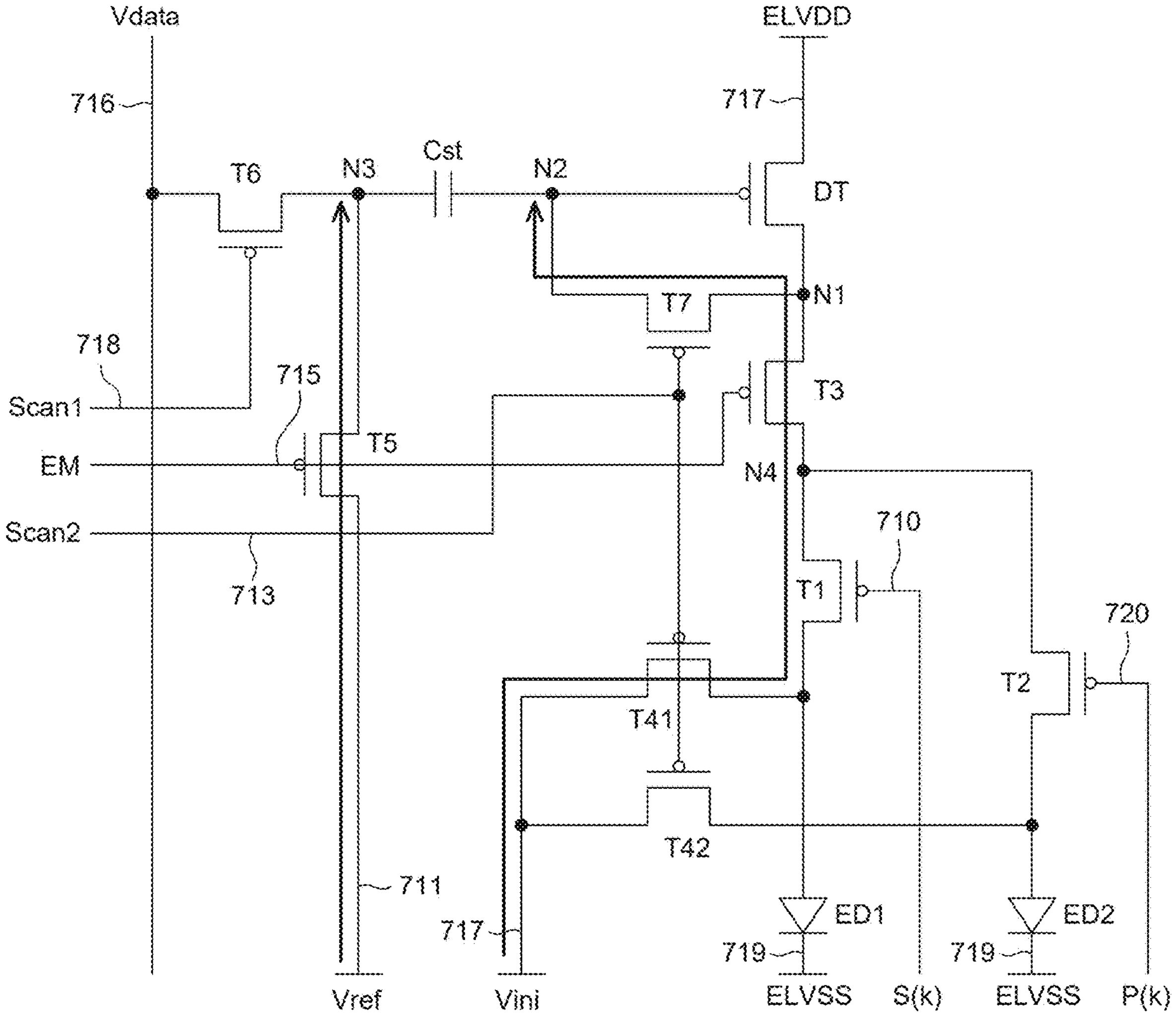
FIGS. 9 and 10 are views for explaining an operation of the pixel circuit in an initialization section of the display apparatus according to an embodiment of the present specification.
Figure 10:
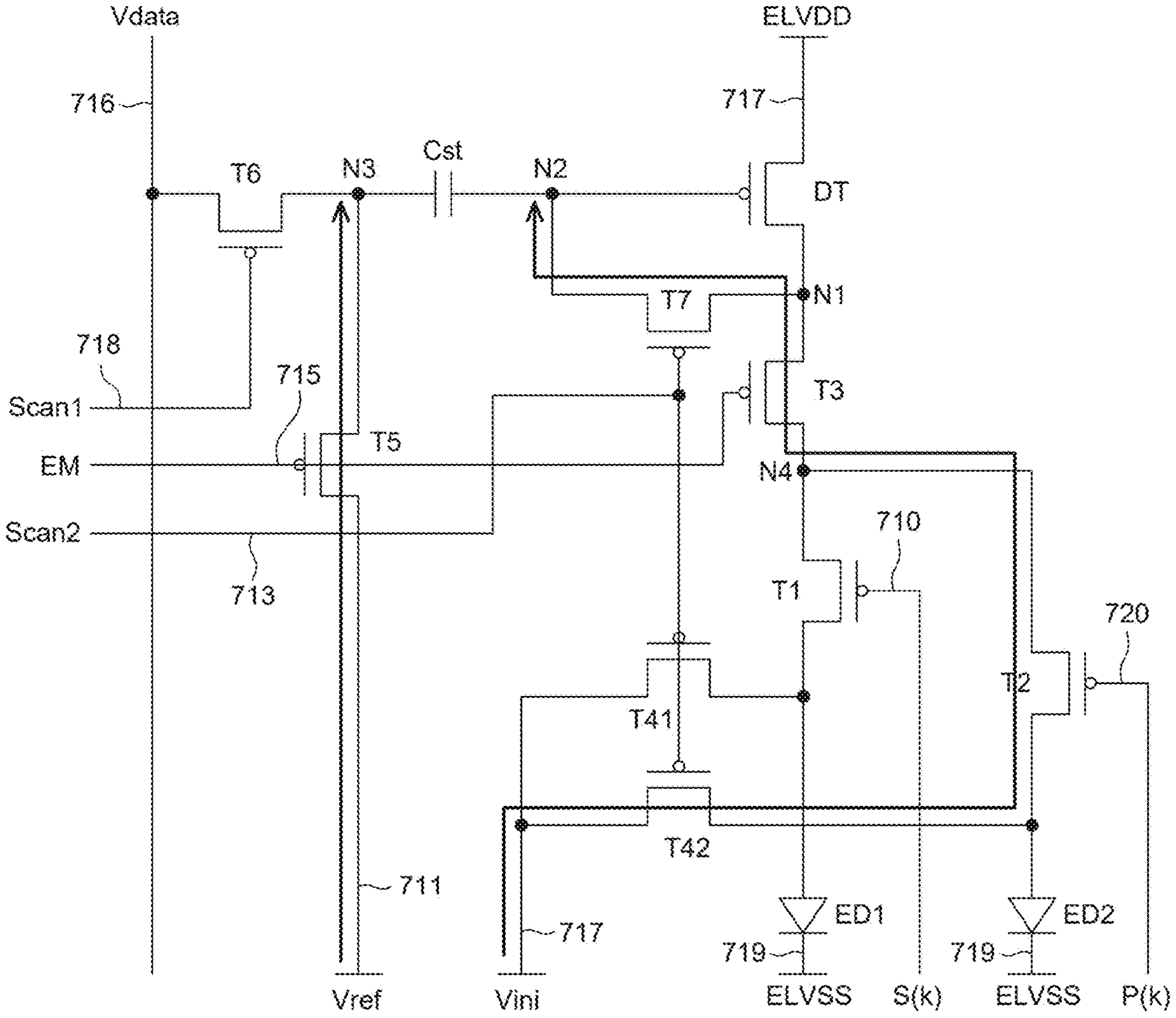

FIGS. 9 and 10 are views for explaining an operation of the pixel circuit in the initialization section of the display apparatus according to the embodiment of the present specification. FIG. 9 illustrates an example of an operation of the pixel circuit in case that the first control signal S(k) is applied as a low-level voltage in the initialization section. FIG. 10 illustrates an example of an operation of the pixel circuit in case that the second control signal P(k) is applied as a low-level voltage in the initialization section. The following description will be described with reference to FIG. 8.

With reference to FIG. 9, in the initialization section P1, as the second scan signal Scan2 is inputted as a low-level voltage, the fourth-second transistor T42 and the seventh transistor T7 may be turned on. In addition, as the light-emitting signal EM is inputted as a low-level voltage, the third transistor T3 and the fifth transistor T5 may be turned on in the initialization section P1. In addition, as the first control signal S(k) is inputted as a low-level voltage, the first transistor T1 may be turned on.

In this case, the reference voltage Vref may be inputted to the third node N3 through the fifth transistor T5. The initialization voltage Vini may be inputted to the second node N2 through at least one of the fourth-first transistor T41, the first transistor T1, the third transistor T3, and the seventh transistor T7. For example, the initialization voltage Vini may be inputted to the second node N2 sequentially through the fourth-first transistor T41, the first transistor T1, the third transistor T3, and the seventh transistor T7. As the initialization voltage Vini is inputted to the second node N2, the voltage of the second node N2 may be changed to be close to a value of the initialization voltage Vini.

In this case, the second node N2 may correspond to the second electrode of the capacitor Cst, and the third node N3 may correspond to the first electrode of the capacitor Cst.

With reference to FIG. 10, in the initialization section P1, as the second scan signal Scan2 is inputted as a low-level voltage, the fourth-second transistor T42 and the seventh transistor T7 may be turned on. In addition, as the light-emitting signal EM is inputted as a low-level voltage, the third transistor T3 and the fifth transistor T5 may be turned on in the initialization section P1. In addition, as the second control signal P(k) is inputted as a low-level voltage, the second transistor T2 may be turned on.

In this case, the reference voltage Vref may be inputted to the third node N3 through the fifth transistor T5. The initialization voltage Vini may be inputted to the second node N2 through the fourth-second transistor T42, the second transistor T2, the third transistor T3, and the seventh transistor T7. As the initialization voltage Vini is inputted to the second node N2, the voltage of the second node N2 may be changed to be close to a value of the initialization voltage Vini.

The first control signal S(k) and the second control signal P(k) are signals provided individually. The two signals may be provided simultaneously or provided at different time points. The timing at which the first control signal S(k) and the second control signal P(k) are provided may change in accordance with the embodiment. However, the present specification is not limited thereto.

In case that the first control signal S(k) and the second control signal P(k) are provided together in the initialization section, the initialization voltage Vini may be inputted to the second electrode of the capacitor Cst, i.e., the second node N2 through the first transistor T1, the second transistor T2, and the third transistor T3. For example, the initialization voltage Vini may be inputted to the second node N2 through a plurality of current paths. For example, as illustrated in FIG. 9, the initialization voltage Vini may be inputted to the second node N2 via the fourth-first transistor T41, the first transistor T1, the third transistor T3, and the seventh transistor T7. In addition, as illustrated in FIG. 10, the initialization voltage Vini may be inputted to the second node N2 via the fourth-second transistor T42, the second transistor T2, the third transistor T3, and the seventh transistor T7.

Figure 11:
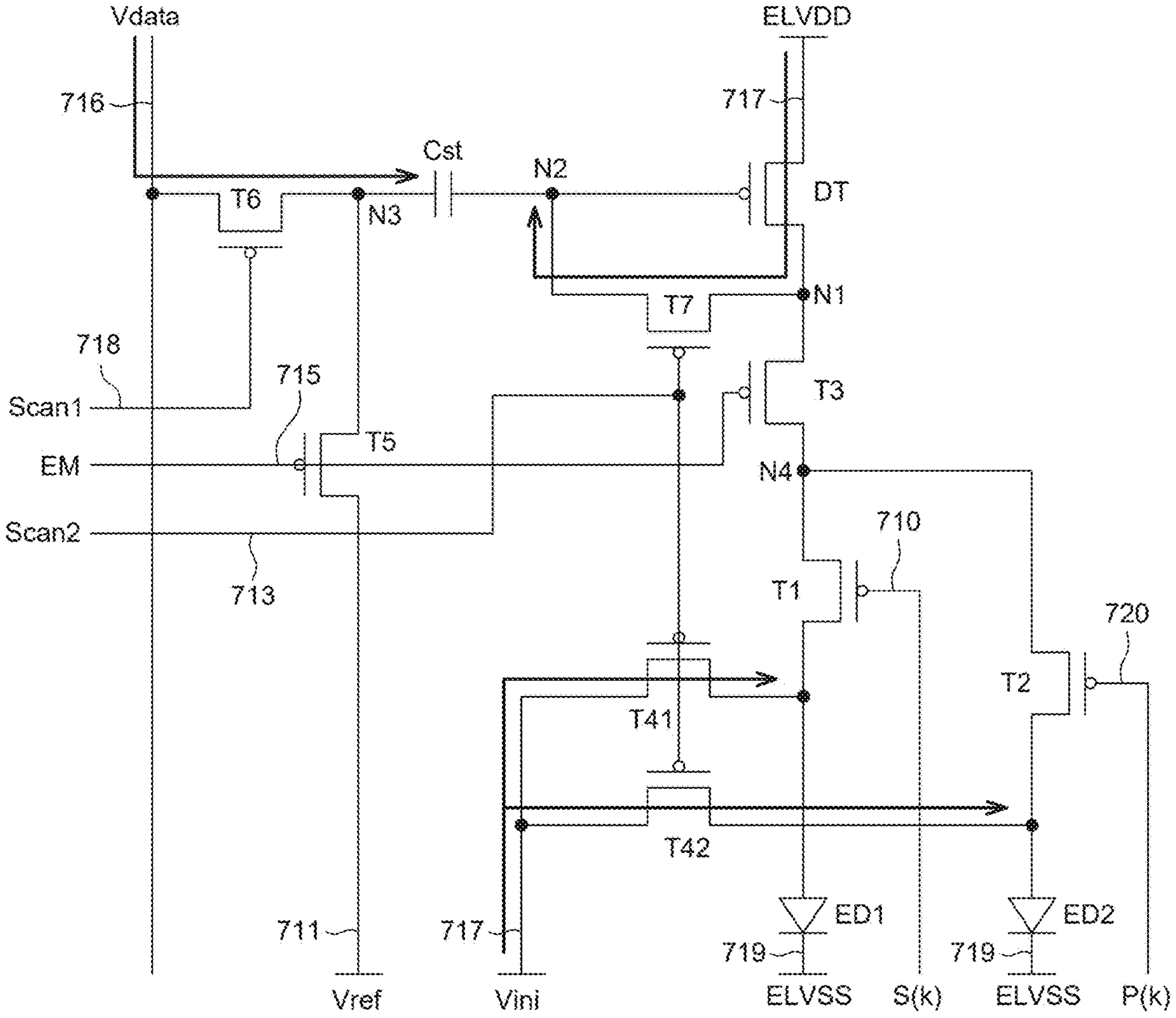
FIG. 11 is a view for explaining an operation of the pixel circuit in a sampling section of the display apparatus according to an embodiment of the present specification.

FIG. 11 is a view for explaining an operation of the pixel circuit in the sampling section of the display apparatus according to the embodiment of the present specification.

With reference to FIG. 11, in the sampling section, the first scan signal Scan1 and the second scan signal Scan2 may be inputted as low-level voltages. The light-emitting signal EM may be inputted as a high-level voltage. In this case, in the sampling section, the fourth-first transistor T41, the fourth-second transistor T42, the seventh transistor T7, and the sixth transistor T6 may be turned on.

In the embodiment, as the fourth-first transistor T41 and the fourth-second transistor T42 are turned on, the initialization voltage Vini may be provided to the anode electrode of the first light-emitting element ED1 and the anode electrode of the second light-emitting element ED2 via the fourth-first transistor T41 and the fourth-second transistor T42. As the seventh transistor T7 is turned on, the high-potential voltage ELVDD may be provided to the second node N2 via the driving transistor DT and the seventh transistor T7. As the sixth transistor T6 is turned on, the data voltage Vdata may be provided to the third node N3 via the sixth transistor T6. In this case, one end of the capacitor Cst may be charged with the data voltage Vdata, such that data writing may be performed.

Therefore, the voltage of the second node N2 may gradually increase to a value corresponding to a difference between the high-potential voltage ELVDD and the threshold voltage Vth. The increase in voltage of the second node N2 may be performed in a shape in which a positive gradient value decreases, as illustrated in FIG. 8.

Although not illustrated, the holding section may be initiated after the sampling section in FIG. 11. In the holding section, the driving transistor DT and the first to sixth transistors T1 to T6 may be turned off. Therefore, the state of the sampling section may be maintained without a separate electric current flow occurring in the pixel circuit.

Figure 12:
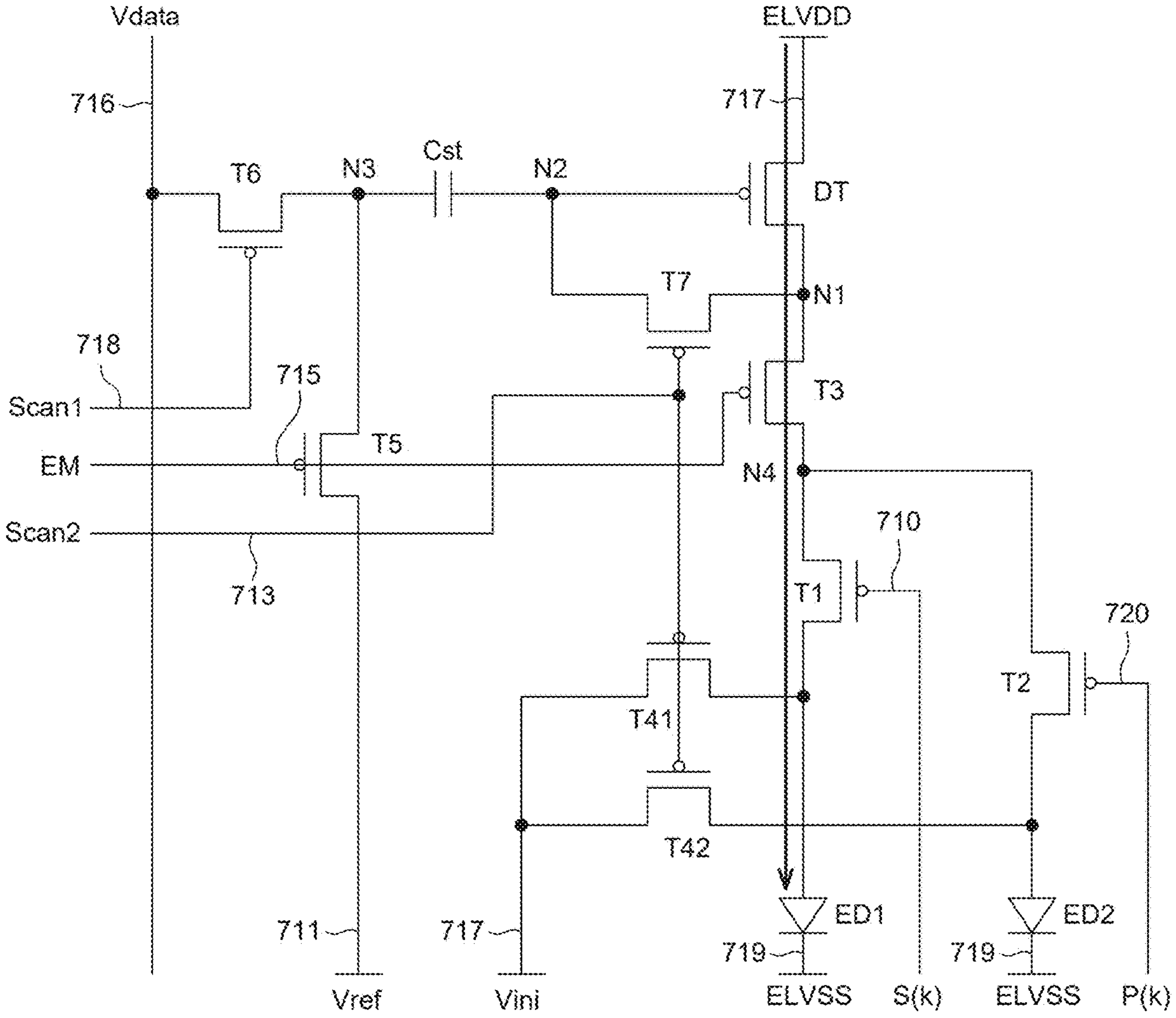
FIGS. 12 and 13 are views for explaining an operation of the pixel circuit in a light-emitting section of the display apparatus according to an embodiment of the present specification.
Figure 13:
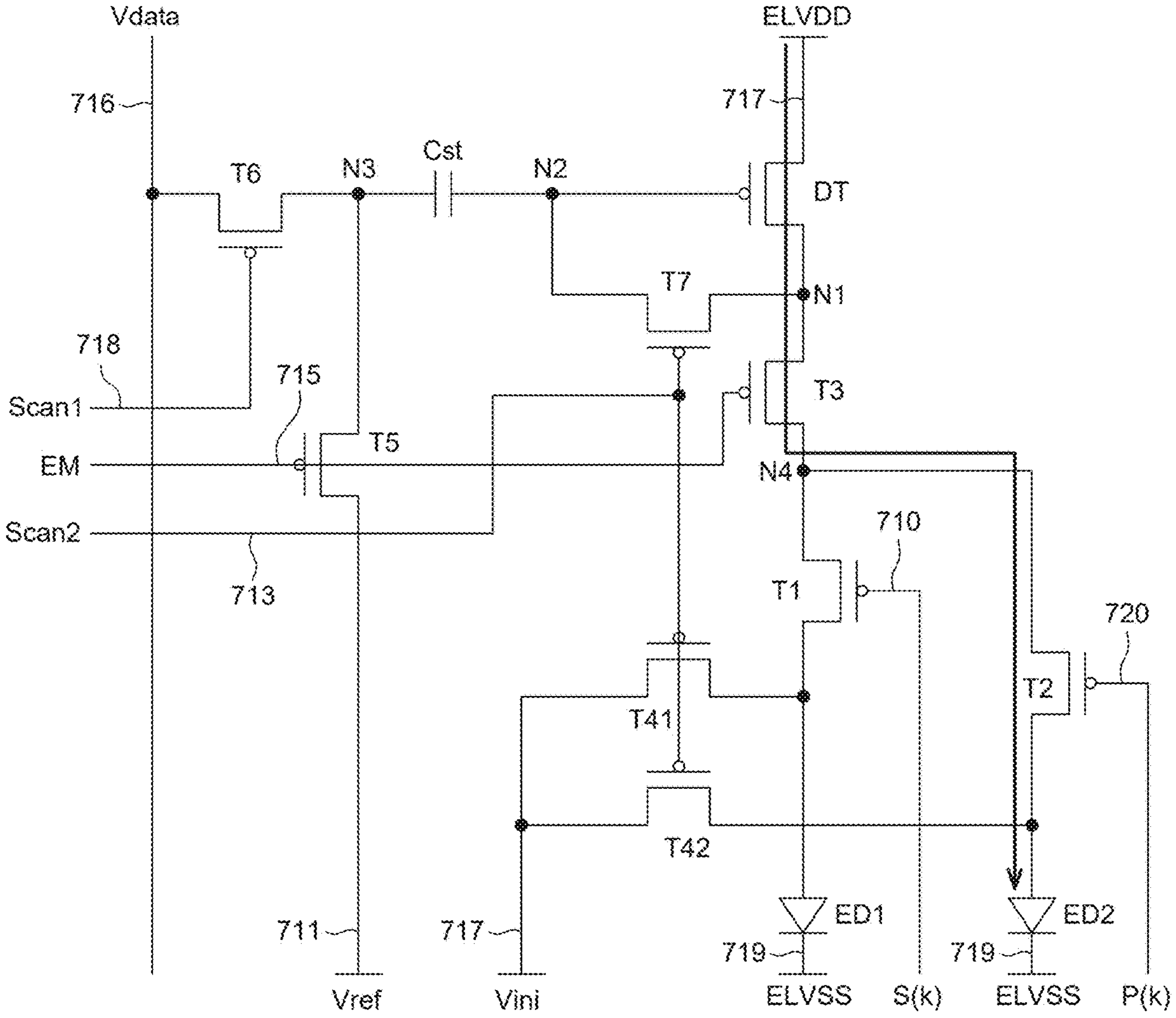

FIGS. 12 and 13 are views for explaining an operation of the pixel circuit in the light-emitting section of the display apparatus according to the embodiment of the present specification.

With reference to FIG. 12, in the light-emitting section, the light-emitting signal EM may be inputted as a low-level voltage. The first scan signal Scan1 and the second scan signal Scan2 may be inputted as high-level voltages. In this case, the third transistor T3 may be turned on.

In case that the operation is performed in the first mode, the first control signal S(k) with a low-level voltage may be provided. In case that the operation is performed in the second mode, the second control signal P(k) with a low-level voltage may be provided. The first mode may include a mode in which the content is provided to both the driver seat and the passenger seat (e.g., a sharing mode). The second mode may include a mode in which a visual field of the driver seat is restricted, and the content is provided to the passenger seat (e.g., a privacy mode or restricted mode). The viewing angle in the first mode may be larger than the viewing angle in the second mode.

In the embodiment, in case that the pixel circuit operates in the first mode, the driving transistor DT, the third transistor T3, and the first transistor T1 may be turned on to define the current path. The high-potential voltage ELVDD may be inputted to the anode electrode of the first light-emitting element ED1. Therefore, the first light-emitting element ED1 may emit light.

In the embodiment, in case that the pixel circuit operates in the second mode, the driving transistor DT, the third transistor T3, and the second transistor T2 may be turned on to define the current path. The high-potential voltage ELVDD may be inputted to the anode electrode of the second light-emitting element ED2. Therefore, the second light-emitting element ED2 may emit light.

Figure 14:
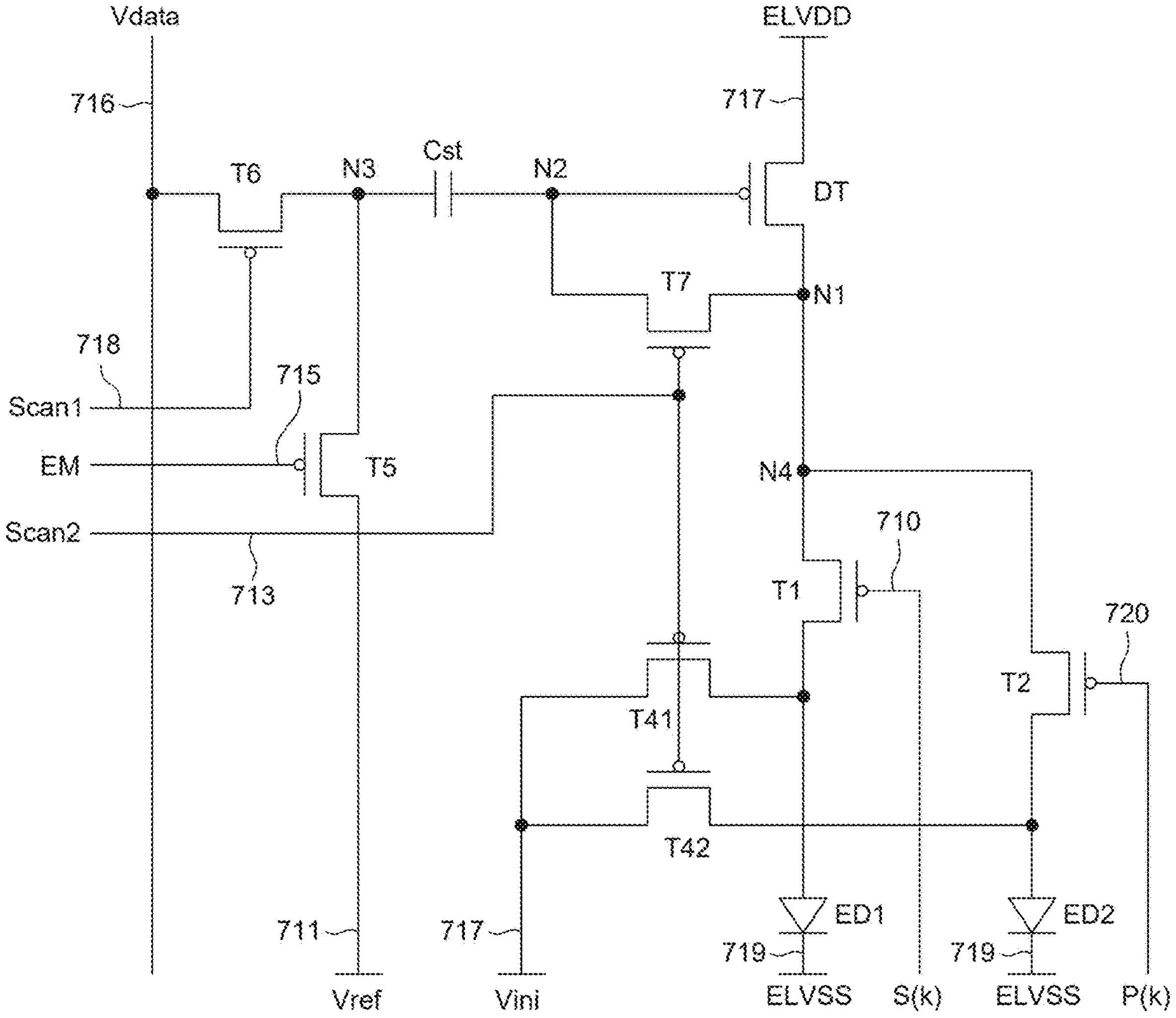
FIG. 14 is a view illustrating a pixel circuit of a display apparatus according to another embodiment of the present specification.

FIG. 14 is a view illustrating a pixel circuit of a display apparatus according to another embodiment of the present specification.

The pixel circuit in FIG. 14 may have a shape in which the third transistor T3 of the pixel circuit described with reference to FIGS. 7 to 13 is excluded. The pixel circuit may have the initialization section, the sampling section, the holding section, and the light-emitting section. The signal timing in each of the sections may operate in the same way as that in FIG. 8. The current path will be described with reference to the above-mentioned descriptions, except for the third transistor T3.

According to the pixel circuit and the display apparatus according to the embodiment of the present specification, the reference voltage Vref and the initialization voltage Vini may be distinguished and used, which may cope with the black spot phenomenon in the initialization section. More specifically, because the pixel circuit and the display apparatus include a plurality of light-emitting elements in order to control viewing angles, the anode area of each of the light-emitting elements may be smaller in comparison with a case in which the single light-emitting element is included. In this case, the black spot phenomenon may occur. However, according to the pixel circuit and the display apparatus of the present specification, the initialization voltage Vini, which is distinguished from the reference voltage Vref, is additionally used, such that the voltages of the anode electrodes of the light-emitting elements ED1 and ED2 may be reduced, which may cope with the black spot phenomenon.

A pixel circuit and a display apparatus according to the exemplary embodiments of the present disclosure can also be described as follows:

A display apparatus according to an exemplary embodiment of the present disclosure includes a mode controller configured to generate a first control signal and a second control signal, a gate drive circuit configured to generate a light-emitting signal, a pixel circuit comprising a driving transistor, a first transistor configured to receive the first control signal, a second transistor configured to receive the second control signal, a first light-emitting element connected to the first transistor, a second light-emitting element connected to the second transistor, a third transistor connected between the driving transistor and the first transistor and configured to operate in response to the light-emitting signal, and a capacitor connected to a gate electrode of the driving transistor, a first lens disposed on the first light-emitting element, and a second lens disposed on the second light-emitting element, wherein in an initialization section of the pixel circuit, a reference voltage is inputted to a first electrode of the capacitor, and an initialization voltage is inputted to a second electrode of the capacitor.

In the embodiments, the initialization voltage may be inputted to the second electrode of the capacitor through the first transistor and the third transistor.

In the embodiments, the initialization voltage may be inputted to the second electrode of the capacitor through the first transistor, the second transistor, and the third transistor.

In the embodiments, the second electrode of the capacitor may be connected to the gate electrode of the driving transistor.

In the embodiments, in a sampling section of the pixel circuit, a data voltage may be inputted to the first electrode of the capacitor, and the initialization voltage may be inputted to the first light-emitting element and the second light-emitting element.

In the embodiments, the pixel circuit may further include a fourth-first transistor and a fourth-second transistor to which the initialization voltage is inputted, wherein a first electrode of the first transistor is connected to the first light-emitting element and the fourth-first transistor, and wherein a first electrode of the second transistor is connected to the second light-emitting element and the fourth-second transistor.

In the embodiments, the pixel circuit may further include a fifth transistor connected to the first electrode of the capacitor and configured to receive the reference voltage.

In the embodiments, the gate drive circuit may further generate a first scan signal and a second scan signal, wherein the fifth transistor may operate in response to the light-emitting signal, and wherein the fourth-first transistor and the fourth-second transistor may operate in response to the second scan signal.

In the embodiments, the pixel circuit may further include a sixth transistor connected to the first electrode of the capacitor, wherein the sixth transistor operates in response to the first scan signal, and wherein a data voltage is inputted to a first electrode of the sixth transistor.

A pixel circuit according to an exemplary embodiment of the present disclosure includes a driving transistor, a first transistor configured to receive a first control signal, a second transistor configured to receive a second control signal, a first light-emitting element connected to the first transistor, a second light-emitting element connected to the second transistor, a third transistor connected between the driving transistor and the first transistor and configured to operate in response to a light-emitting signal provided from a gate drive circuit and a capacitor connected to a gate electrode of the driving transistor, wherein a first lens is disposed on the first light-emitting element, and a second lens is disposed on the second light-emitting element, and wherein in an initialization section, a reference voltage is inputted to a first electrode of the capacitor, and an initialization voltage is inputted to a second electrode of the capacitor.

In the embodiments, the initialization voltage may be inputted to the second electrode of the capacitor through the first transistor and the third transistor.

In the embodiments, the initialization voltage may be inputted to the second electrode of the capacitor through the first transistor, the second transistor, and the third transistor.

In the embodiments, the second electrode of the capacitor may be connected to the gate electrode of the driving transistor.

In the embodiments, in a sampling section, a data voltage may be inputted to the first electrode of the capacitor, and the initialization voltage may be inputted to the first light-emitting element and the second light-emitting element.

In the embodiments, the pixel circuit may further include a fourth-first transistor and a fourth-second transistor to which the initialization voltage is inputted, wherein a first electrode of the first transistor is connected to the first light-emitting element and the fourth-first transistor, and wherein a first electrode of the second transistor is connected to the second light-emitting element and the fourth-second transistor.

In the embodiments, the pixel circuit may further include a fifth transistor connected to the first electrode of the capacitor and configured to receive the reference voltage.

In the embodiments, the gate drive circuit may generate a first scan signal and a second scan signal, wherein the fifth transistor operates in response to the light-emitting signal, and wherein the fourth-first transistor and the fourth-second transistor operate in response to the second scan signal.

In the embodiments, the pixel circuit may further include a sixth transistor connected to the first electrode of the capacitor, wherein the sixth transistor operates in response to the first scan signal, and wherein a data voltage is inputted to a first electrode of the sixth transistor.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus comprising:

a gate drive circuit configured to generate a light-emitting signal;

a pixel circuit comprising a driving transistor, a first transistor configured to receive a first control signal, a second transistor configured to receive a second control signal, a first light-emitting element connected to the first transistor, a second light-emitting element connected to the second transistor, a third transistor connected between the driving transistor, the first transistor, and the second transistor and configured to operate in response to the light-emitting signal, a capacitor connected to a gate electrode of the driving transistor and including a first electrode and a second electrode, and a sixth transistor connected between a data line and the first electrode of the capacitor;

a first lens on the first light-emitting element; and a second lens on the second light-emitting element, wherein during an initialization period of the pixel circuit, a reference voltage is applied to the first electrode of the capacitor and an initialization voltage is applied to the second electrode of the capacitor while the reference voltage is applied to the first electrode of the capacitor, wherein the sixth transistor includes a source electrode directly connected to the data line, a drain electrode directly connected to the first electrode of the capacitor, and a gate electrode connected to a first scan signal line configured to transmit a first scan signal, and wherein the sixth transistor applies a data voltage to the first electrode of the capacitor in response to the first scan signal, and wherein the pixel circuit further comprises:

a fourth-first transistor applied with the initialization voltage, the fourth-first transistor directly connected to the first light-emitting element and an electrode of the first transistor; and a fourth-second transistor applied with the initialization voltage, the fourth-second transistor directly connected to the second light-emitting element and an electrode of the second transistor.

2. The display apparatus of claim 1, wherein the initialization voltage is applied to the second electrode of the capacitor through the first transistor and the third transistor while the first control signal is applied to the first transistor without the second control signal being applied to the second transistor.

3. The display apparatus of claim 1, wherein the initialization voltage is applied to the second electrode of the capacitor through the second transistor and the third transistor while the second control signal is applied to the second transistor without the first control signal being applied to the first transistor.

4. The display apparatus of claim 1, wherein the second electrode of the capacitor is connected to the gate electrode of the driving transistor.

5. The display apparatus of claim 1, wherein in a sampling period of the pixel circuit, a data voltage is applied to the first electrode of the capacitor, and the initialization voltage is applied to the first light-emitting element and the second light-emitting element.

6. The display apparatus of claim 1, wherein the pixel circuit further comprises:

a fifth transistor connected to the first electrode of the capacitor, the fifth transistor applied with the reference voltage.

7. The display apparatus of claim 6, wherein the gate drive circuit is further configured to generate the first scan signal and a second scan signal, wherein the fifth transistor operates in response to the light-emitting signal, and the fourth-first transistor and the fourth-second transistor operate in response to the second scan signal.

8. The display apparatus of claim 7, wherein the sixth transistor includes an electrode that is applied with a data voltage and operates in response to the first scan signal.

9. A pixel circuit comprising:

a driving transistor including a gate electrode;

a first transistor configured to receive a first control signal;

a second transistor configured to receive a second control signal;

a first light-emitting element connected to the first transistor;

a second light-emitting element connected to the second transistor;

a third transistor connected between the driving transistor and the first transistor and connected between the driving transistor and the second transistor, the third transistor configured to receive a light-emitting signal from a gate drive circuit;

a capacitor connected to the gate electrode of the driving transistor, the capacitor including a first electrode and a second electrode;

a sixth transistor connected between a data line and the first electrode of the capacitor;

a fourth-first transistor applied with an initialization voltage, the fourth-first transistor directly connected to the first light-emitting element and an electrode of the first transistor; and a fourth-second transistor applied with the initialization voltage, the fourth-second transistor directly connected to the second light-emitting element and an electrode of the second transistor, wherein the sixth transistor includes a source electrode directly connected to the data line, a drain electrode directly connected to the first electrode of the capacitor, and a gate electrode connected to a first scan signal line configured to transmit a first scan signal, wherein a first lens is on the first light-emitting element but not the second light-emitting element, and a second lens is on the second light-emitting element but not the first light-emitting element, wherein during an initialization period of the pixel circuit, a reference voltage is applied to the first electrode of the capacitor and the initialization voltage is applied to the second electrode of the capacitor while the reference voltage is applied to the first electrode of the capacitor, and wherein the sixth transistor applies a data voltage to the first electrode of the capacitor in response to the first scan signal.

10. The pixel circuit of claim 9, wherein the initialization voltage is applied to the second electrode of the capacitor through the first transistor and the third transistor while the first control signal is applied to the first transistor without the second control signal being applied to the second transistor.

11. The pixel circuit of claim 9, wherein the initialization voltage is inputted to the second electrode of the capacitor through the second transistor and the third transistor while the second control signal is applied to the second transistor without the first control signal being applied to the first transistor.

12. The pixel circuit of claim 9, wherein the second electrode of the capacitor is connected to the gate electrode of the driving transistor.

13. The pixel circuit of claim 9, wherein in a sampling period, a data voltage is applied to the first electrode of the capacitor, and the initialization voltage is applied to the first light-emitting element and the second light-emitting element.

14. The pixel circuit of claim 9, further comprising:

a fifth transistor connected to the first electrode of the capacitor, the fifth transistor applied with the reference voltage.

15. The pixel circuit of claim 14, wherein the gate drive circuit is configured to generate the first scan signal and a second scan signal, wherein the fifth transistor operates in response to the light-emitting signal, and the fourth-first transistor and the fourth-second transistor operate in response to the second scan signal.

16. The pixel circuit of claim 15, wherein the sixth transistor includes an electrode that is supplied with a data voltage and operates in response to the first scan signal.

17. A pixel circuit comprising:

a driving transistor including a first electrode of the driving transistor, a second electrode of the driving transistor, and a gate electrode of the driving transistor;

an emission transistor including a first electrode of the emission transistor that is connected to the second electrode of the driving transistor, a second electrode of the emission transistor, and a gate electrode configured to receive a light-emitting signal;

a first mode transistor including a first electrode of the first mode transistor that is connected to the second electrode of the emission transistor, a second electrode of the first mode transistor, and a gate electrode of the first mode transistor that is configured to receive a first control signal responsive to a first mode of the pixel circuit associated with a first viewing angle;

a second mode transistor including a first electrode of the second mode transistor that is connected to the second electrode of the emission transistor and the first electrode of the first mode transistor, a second electrode of the second mode transistor, and a gate electrode of the second mode transistor that is configured to receive a second control signal responsive to a second mode of the pixel circuit associated with a second viewing angle that is different from the first viewing angle;

a first light emitting diode connected to the second electrode of the first mode transistor, the first light emitting diode configured to emit light during the first mode;

a second light emitting diode connected to the second electrode of the second mode transistor, the second light emitting diode configured to emit light during the second mode;

a capacitor including a first capacitor electrode and a second capacitor electrode, the second capacitor electrode connected to the gate electrode of the driving transistor;

a sixth transistor connected between a data line and the first electrode of the capacitor;

a first initialization transistor including a first electrode of the first initialization transistor that is directly connected to the second electrode of the first mode transistor and the first light emitting diode, a second electrode of the first mode transistor that is directly connected to an initialization voltage line that supplies an initialization voltage, and a gate electrode of the first initialization transistor that is configured to receive a second scan signal; and a second initialization transistor including a first electrode of the second initialization transistor that is directly connected to the second electrode of the second mode transistor and the second light emitting diode, a second electrode of the second initialization transistor that is directly connected to the initialization voltage line that supplies the initialization voltage, and a gate electrode of the second initialization transistor that is connected to the gate electrode of the first initialization transistor and configured to receive the second scan signal, wherein the sixth transistor includes a source electrode directly connected to the data line, a drain electrode directly connected to the first electrode of the capacitor, and a gate electrode connected to a first scan signal line configured to transmit a first scan signal, wherein during an initialization period of the pixel circuit in each of the first mode and the second mode, a reference voltage is applied to the first capacitor electrode of the capacitor and the initialization voltage is applied to the second capacitor electrode of the capacitor while the reference voltage is applied to the first capacitor electrode of the capacitor, and wherein the sixth transistor applies a data voltage to the first electrode of the capacitor in response to the first scan signal.

18. The pixel circuit of claim 17, further comprising:

a data transistor including a first electrode of the data transistor that is connected to a data line that applies a data voltage to the first electrode, a second electrode of the data transistor that is connected to the first capacitor electrode, and a gate electrode of the data transistor that is configured to receive the first scan signal;

a reference transistor including a first electrode of the reference transistor that is connected to the second electrode of the data transistor and the first capacitor electrode, and a gate electrode of the reference transistor that is connected gate electrode of the emission transistor, the gate electrode of the reference transistor configured to receive the light-emitting signal; and a connection transistor including a first electrode of the connection transistor that is connected to the second capacitor electrode and the gate electrode of the driving transistor, a second electrode of the connection transistor that is connected to the second electrode of the driving transistor and the first electrode of the emission transistor, and a gate electrode of the connection transistor that is connected to the gate electrode of the first initialization transistor and the gate electrode of the second initialization transistor, the gate electrode of the connection transistor configured to receive the second scan signal.

19. The pixel circuit of claim 18, wherein during the initialization period of the first mode, the reference voltage is applied to the first capacitor electrode responsive to the reference transistor being turned on from receiving the light-emitting signal, and the initialization voltage is applied to the second capacitor electrode responsive to the first initialization transistor being turned on from receiving the second scan signal, the first mode transistor being turned on from receiving the first control signal, the emission transistor being turned on from receiving the light-emitting signal, and the connection transistor being turned on from receiving the second scan signal.

20. The pixel circuit of claim 19, wherein the second mode transistor is turned off during the initialization period of the first mode.

21. The pixel circuit of claim 18, wherein during the initialization period of the second mode, the reference voltage is applied to the first capacitor electrode responsive to the reference transistor being turned on from receiving the light-emitting signal, and the initialization voltage is applied to the second capacitor electrode responsive to the second initialization transistor being turned on from receiving the second scan signal, the second mode transistor being turned on from receiving the second control signal, the emission transistor being turned on from receiving the light-emitting signal, and the connection transistor being turned on from receiving the second scan signal.

22. The pixel circuit of claim 21, wherein the first mode transistor is turned off during the initialization period of the second mode.

23. The pixel circuit of claim 17, wherein a first lens having a first shape is disposed over the first light emitting diode and a second lens having a second shape that is different from the first shape in a plan view of the pixel circuit is disposed over the second light emitting diode.

24. The pixel circuit of claim 17, wherein the second viewing angle is wider than the first viewing angle.

* * * * *